United States Patent [19]
Nishida et al.

[11] Patent Number: 5,436,848
[45] Date of Patent: Jul. 25, 1995

[54] METHOD OF AND DEVICE FOR TRANSPORTING SEMICONDUCTOR SUBSTRATE IN SEMICONDUCTOR PROCESSING SYSTEM

[75] Inventors: Masami Nishida; Masahiro Himoto; Tetsuya Hamada; Noriaki Yokono; Takeo Okamoto, all of Kyoto, Japan

[73] Assignee: Dainippon Screen Mfg. Co., Ltd., Kyoto, Japan

[21] Appl. No.: 47,449

[22] Filed: Apr. 15, 1993

Related U.S. Application Data

[63] Continuation-in-part of Ser. No. 750,794, Aug. 27, 1991, abandoned.

[30] Foreign Application Priority Data

Sep. 3, 1990 [JP] Japan ............................ 2-234095

[51] Int. Cl.⁶ .......................................... G06F 19/00
[52] U.S. Cl. .................................. 364/488; 364/468; 414/222
[58] Field of Search ............... 364/478, 468, 488, 550, 364/551.01, 552; 414/222, DIG. 1, DIG. 3, DIG. 6; 198/617, 618, 619

[56] References Cited

U.S. PATENT DOCUMENTS 4,664,578 5/1987 Kakehi .................. 414/222
5,110,394 5/1992 Ogawa .................. 156/345

FOREIGN PATENT DOCUMENTS 1-49010 10/1989 Japan.

*Primary Examiner*—Vincent N. Trans
*Attorney, Agent, or Firm*—Lowe, Price, LeBlanc & Becker

[57] ABSTRACT

A robot (12) takes a wafer (3f) out of an indexer (1) and then transports the same to a heat processing part (41). A wafer (3e), which has already introduced in the heat processing part (41) is took out thereof by the robot (5). The wafer (3f) is introduced in the heat processing part (41) after a waiting time (18a) so that an excess heat processing in the heat processing part (41) can be avoided. The wafer (3e) is transported to a processing part (43) and introduced therein by the robot (5). After the robot (5) repeats the similar processings in processing parts (13, 42, 44), it returns to the wafer transferring robot (12) to receive a next wafer. At that time, the robot (5) waits for a predetermined time thereby a cycle time is adjusted. After the waiting, the robot (5) takes out the wafer (3f), which has been introduced in the heat processing part (41), out thereof. Since the cycle time is set in common for different lots, the waiting times (18a, 18b) are set individually for each lot.

60 Claims, 16 Drawing Sheets

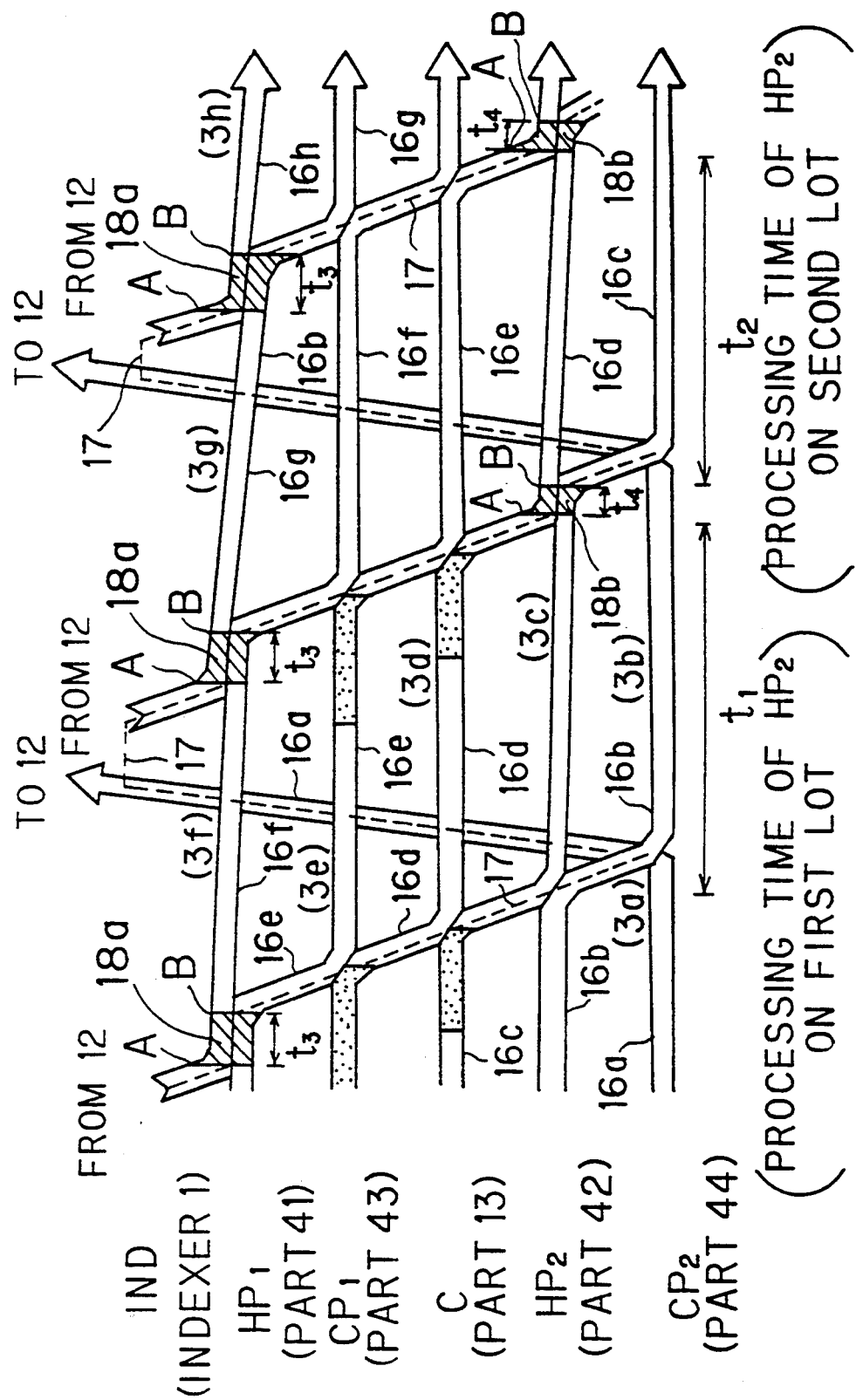

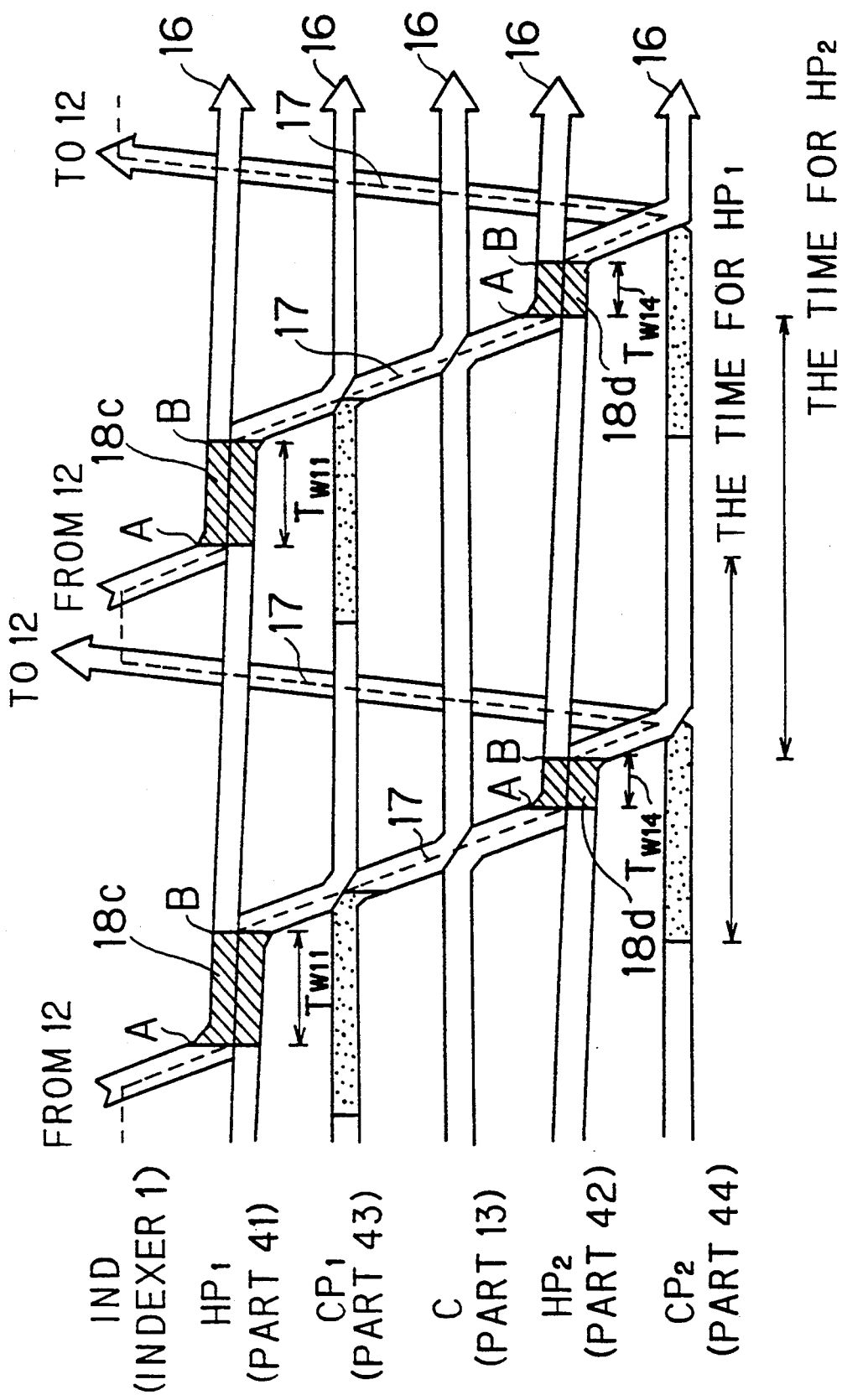

FIG. 14 (a) (PRIOR ART)
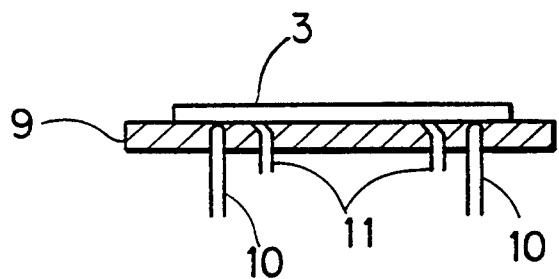
FIG. 14 (b) (PRIOR ART)
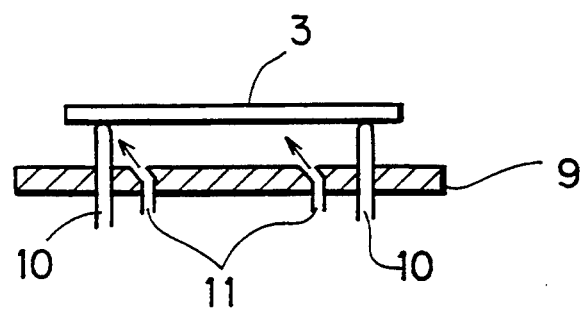

METHOD OF AND DEVICE FOR TRANSPORTING SEMICONDUCTOR SUBSTRATE IN SEMICONDUCTOR PROCESSING SYSTEM

This application is a continuation-in-part application of Ser. No. 07/750,794, filed Aug. 27, 1991 now abandoned.

FIELD OF THE INVENTION

Method of and Device for Transporting Semiconductor Substrate in Semiconductor Processing System.

BACKGROUND OF THE INVENTION

The present invention relates to a method of and a, device for transporting a semiconductor substrate in a semiconductor processing system, and more particularly, it relates to an improved timing control in a semiconductor processing system wherein a transportation mechanism circulates through a plurality of substrate processing parts including a heat processing part in a predetermined order to thereby sequentially transport a plurality of semiconductor substrates to these processing parts.

DESCRIPTION OF THE PRIOR ART

Heat processings or thermal treatment for semiconductor substrates are extremely important in the fabrication of semiconductor devices. For example, in a photolithography technology, which is required to diffuse an impurity into a semiconductor as well as to make patterns for circuits into a desired configuration, heat processings for photoresists have a great influence on a patterning accuracy.

Various kinds of devices have been brought into practice in order to carry out heat processings in high efficiency for a large number of substrates.

FIG. 13A is a plan view showing a conception of a heat processor for semiconductor substrates.

Cassettes 2 storing semiconductor substrates such as silicone wafers 3, for example, are mounted on an indexer 1. A moving mechanism 8 and a robot 5 are mounted on a stage 6. The robot 5 comprises a first arm 71 and a second arm 72 which is hidden under the first arm 71 and therefore is not shown in FIG. 13A. In the opposite side of the indexer 1 across the stage 6, there are provided heat processing parts 41 and 42 and cool processing parts 43 and 44. Since the cool processing parts 43 and 44 are hidden under the heat processing parts 41 and 42, they are not shown in FIG. 13A.

The operation of the heat processor will be described now. The moving mechanism 8 moves and rotates the robot 5 as shown by arrows R and Q, respectively, so that the robot 5 travels on the stage 6. The arms 71 and 72 can be stretched and withdrawn so that the arms 71 and 72 can take the wafer 3 in and out of a place which is distant from the robot 5. Through this operation of the robot 5 for transporting the wafers 3, each wafer 3 stored in the cassettes 2 are taken out of the cassette 2 one after another, and circulates through the heat processing part 41, the cool processing part 43, the heat processing part 42 and the cool processing part 44, in that order. Each of the wafers 3 is subjected to predetermined heat processing or cool processing in these processing parts, and then, is stored in its home cassette 2 again. For the purpose of conducting a series of the processing in short time on a large number of wafers, the wafers 3 are transported in a sequential way in which a step of taking out one wafer from one processing part is conducted in connection with a step of introducing a next wafer into the processing part. For example, when one wafer which has been subjected to the heat processing in the heat processing part 41 is transported to the cool processing part 43, another wafer which is next to be processed in the heat processing part 41 is introduced in the heat processing part 41. Accordingly, each wafer is sequentially subjected to the respective processings in the processing parts 41 to 44, in that order. From a different point of view, the processing parts 41 to 44 conduct the respective processings in parallel at the same time on the wafers which are contained therein, respectively. FIG. 13B conceptually shows a flow of these processings and transportations. The robot 5 repeats transportation steps $F_1$ to $F_5$, in that order.

The times required for completing the respective heat and cool processings in the processing parts 41 to 44 are determined as shown in Table 1, for example.

TABLE 1

| Heat Processing Part 41 | 60 seconds |
|---|---|
| Cool Processing Part 43 | 45 seconds |
| Heat Processing Part 42 | 70 seconds |
| Cool Processing Part 44 | 45 seconds |

The robot 5 requires 8 seconds to move from one processing part to the next processing part and to take a wafer 3 out thereof and take another wafer 3 therein. The indexer 1 is considered as one of these processing parts.

In a steady state in which a stream of wafers 3 are flowing through all the processing parts 41, 42, 43 and 44, the rate of circulating the robot 5 for transporting the wafers 3 along the processing parts 41, 42, 43 and 44 is limited to value depending on the heat processing time in the heat processing part 42. This is because the heat processing in the heat processing part 42 requires the longest processing time of 70 seconds among respective processing times. For example, supposed is a time point at which the robot 5 holding a wafer reaches the processing part 42. In this time point, the process in the processing part 42 for a prior wafer has not been completed and it is impossible to take out the prior wafer to introduce the new wafer into the part 42. Accordingly, the robot 5 must wait the completion of the process of 70 seconds in the part 42 for the prior wafer and cannot enter the following transportation processes $F_4$, $F_5$, $F_1$, $F_2$ and $F_3$. Therefore, the exchange of the wafers in the part 42 and the transportation $F_4$ with the robot 5 can be started only after at least 70 seconds has passed from the time point at which the transportation step $F_4$ has started last time. That is, it takes at least 70 seconds for the robot 5 to make a round of the transportation route. As to the heat processing part 41 which requires the processing time of 60 seconds, for example, at least 70 seconds has past when the robot 5 returns thereto since the robot 5 left there last time. The time required for the transportation operation of the robot 5 is 8 seconds $\times 5 = 40$ seconds, and therefore this operation is not a factor for limiting the rate of rounding the process path. Accordingly, during the stream of the wafers are flowing through all the processing parts 41, 42, 43 and 44, the wafer 3 in one processing part always is transported to the next processing part at intervals of at least 70 seconds which is required for completion of the heat processing in the heat processing part 42. Therefore, the wafers 3 stay in each of the processing parts 41 to 44 for about 70 seconds, regardless of the original processing times which are required for the respective proceessings in the processing parts 41 to 44.

In the processings for a photoresist, it brings substantially no problem that the respective processing times in the cool processing parts 43 and 44 are prolonged to 70 seconds. In some cases, however, prolongation of the processing time in the heat processing part 41 has a harmful effect on the photoresist. Specifically, a patterning accuracy for the photoresist is deteriorated by overheating.

Japanese Patent Publication Gazette No. 1-49010 (1989) discloses a technology of avoiding the above-mentioned problem. This technology will be now briefly described, referring to FIGS. 14(a) and 14(b). In the heat processing part a lifting supporter 10 which supports the wafer 3, and a cooling air nozzle 11 are provided on a hot plate 9. The wafer 3 is maintained in contact with the hot plate 9 while the heat processing is conducted thereon, as shown in FIG. 14(a). After the heat processing is conducted for a desired processing time, the wafer 3 is lifted up by the lifting supporter 10 to be separated from the hot plate 9, and at the same time, cooling air is sprayed to the wafer 3 through the cooling air nozzle 11 to thereby cool the wafer 3, as shown in FIG. 14(b).

With this technology, however, the cost of an overall heat processing part increases significantly. Furthermore, temperature distribution on the hot plate 9 itself is not uniform since the vicinity of the cooling air nozzle 11 is overcooled. As a result, temperature distribution on the wafer 3 becomes also ununiform. In order to avoid the ununiform temperature distribution, the wafer 3 may be separated from the hot plate 9 by the lifting supporter 10 without spray of air. Although this technique is for reducing the overheating in some degree, it can not prevent a harmful effect exerted on the photoresist.

This will be explained, referring to FIGS. 15(a) and 15(b). FIG. 15(a) is a graph illustrating an ideal temperature curve in the heat processing part 41 and indicates that the heat processing therein should be conducted at a temperature of 100° C. for 60 seconds. On the other hand, FIG. 15(b) is a graph illustrating an actual temperature curve in the heat processing part 41 when the wafer 3 moves through the processing parts 41, 43, 42 and 44, in that order. Even if the wafer 3 is separated from the hot plate 9 after 60 seconds has passed, excess heat represented by a hatched portion in FIG. 15(b) is applied to the wafer 3. Therefore, it is difficult to obtain an actual temperature curve approximating the ideal temperature curve only by separating the wafer 3 from the hot plate 9 after the required heat processing in the heat processing part 41 is completed.

There is another problem when a plurality of wafer lots are processed in series and their respective processing times required are different from each other. When wafers contained in these lots are continuously processed, the amount of the excess heat varies among wafers in the same lot. An example is given for the case where first and second lots are processed in series under the condition that wafers in the first lot are processed according to Table I while wafers in the second lot are processed in a processing part 42 for 65 seconds and are processed in the other processing parts 41, 43 and 44 according to Table 1. In such a case, the longest processing time changes from 70 seconds to 65 seconds when the first wafer in the second lot following the last wafer in the first lot enters the processing path. Accordingly, an overheating time in the heat processing part 41 changes from 10 seconds to 5 seconds. Therefore, within the wafers in the second lot, some wafers are subjected to excess heat processing for 10 seconds and the other wafers are subjected to excess heat processing for 5 seconds. As a result, important control parameters such as a critical photo-exposure value in exposing and developing the photoresist varies from wafer to wafer. The "critical photo-exposure value" is such a photo-exposure value that photosensitive material exposed to light can entirely dissolve under a certain developing condition.

The problems described above are not limited in a transition period of a series of the processings from one lot to the next lot in the case where a plurality of the lots having different processing times are continuously processed. In general, these problems are remarkably significant in transition periods such as: an initial period in which the processing of a lot is started but the steady state has not been reached; and an ending period in which the last wafer in a lot has entered the processing path but the respective processings of the last wafer has not completed.

SUMMARY OF THE INVENTION

The present invention is directed to a method of sequentially transporting semiconductor substrates with a transportation means in a system having first to N-th processing parts for applying predetermined processings to the semiconductor substrates.

The first to N-th processing parts have at least one heat processing part for applying heat to the semiconductor substrate, and the semiconductor substrates are transported along transportation path circulating the first to N-th processing parts, where the number N is an integer larger than one.

According to the present invention, the method comprises the steps of: (a) determining parameter values including a single cycle time $T_0$ common to the first to N-th processing parts and a waiting time $T_{wj}$ for each number j satisfying $1 \leq j \leq N$; and, (b) serially transporting the semiconductor substrates to the first to N-th processing parts with the transporting means such that the transporting means repeatedly circulates along the processing path and a stream of the semiconductor substrates flows along the processing path via the first to N-th processing parts.

In order to avoid excess heat on semiconductor substrates, obtained is a state in which semiconductor substrates $S_{j-1}$, $S_j$ and $S_{j+1}$ having come from the (j−2)-th, (j−1)-th and j-th processing parts are present in the (j−1)-th, j-th and (j+1)-th processing parts, respectively.

Then, the semiconductor substrate $S_{j-1}$ from the (j−1)-th processing part is transported to the j-th processing part with the transporting means. The transportation mean waits before the j-th processing part until the cycle time $T_0$ is past since the transporting means having taken the semiconductor substrate $S_{j+1}$ out of the j-th processing part.

The transportation means takes the semiconductor substrate $S_j$ out of the j-th processing part when the cycle time $T_0$ is past, and further waiting for the waiting time $T_{wj}$.

Then, the transportation means introduces the semiconductor substrate $S_{j-1}$ into the j-th processing part when the waiting time $T_{wj}$ is past, and transports the semiconductor substrate $S_j$ to the (j+1)-th with the transporting means.

These steps are repeated for j=1, 2, ..., N, where:
the (j−2)-th processing part for j=1 and 2;
the (j−1)-th processing part for j=1; and
the (j+1)-th processing part for j=N;
represent a station for supplying the semiconductor substrate to the processing path and receiving the semiconductor substrates having been processed.

Preferably, finite waiting values are provided only to the heat processing parts.

According to the present invention, finite waiting times are provided before the heat processing parts so that variations in temperature curves due to an excess heat processing can be avoided even when the series of processings are conducted on a plurality of semiconductor substrates. The common cycle time is also applied in a transition period. The cycle time may be determined so as to be longer than the sum of the circulation time and the total waiting time that the transportation means undergoes during one circulation through all the processing parts, so that a finite waiting time can be provided to at least one processing part.

There may be another condition required for the cycle time. The cycle time is longer than the sum of the waiting times and the processing time in the heat processing part at which the finite waiting time is provided, and at the same time, it is longer than any of the processing times of those processing parts at which a waiting time is not provided. If the cycle time is determined so as to satisfy these conditions, the processing in each processing part has been completed by when the transportation means comes to processing part again after it left there last time and circulated through all the processing parts, regardless of whether the processing part is a heat processing part at which the finite waiting time is provided or another processing part at which a finite waiting time is not provided. Particularly, in the heat processing part at which the finite waiting time is provided, the time of the termination of the processing therein coincides with the time of the return of the transportation means thereto after it circulates through all the processing parts. Therefore, the semiconductor substrate is transported from the heat processing part immediately after the heat processing thereon is completed.

The transportation means transports wafers on the basis of the cycle time thus determined so that a series of the processing can be conducted in uniformity on a set of semiconductor substrates even in the transition period of the series of the processings from one set of semiconductor substrates to another set of semiconductor substrates. A part of the difference between the cycle time and the processing time of the heat processing part is used as the waiting time by the transportation means in front of the heat processing part. Therefore, when the cycle time is determined in common throughout the processings, the temperature curve of the heat processings is not affected.

In the present invention, the word "circulation" or "circulate" is used for representing the motion in which the transportation means moves along the processing path and then returns to an original position. The circulation may be a loop-like movement or a shuttle-like movement.

The "transportation time" is such a time in which the transportation means circulates along the processing path and does not include the processing times at the processing parts.

The "cycle time" corresponds to the time which passes from when the transportation means starts the operation at one processing part till when it starts the same operation again at the same processing part after it completes a series of sequential operations.

Accordingly, an object of the present invention to provide a method of and a device for transporting a semiconductor substrate in a semiconductor processing system, wherein an excess heat processing can be avoided to conduct heat processings in a desired heat processing time and control parameters do not vary even in a transition period of processing from one series of semiconductor substrates to another series of semiconductor substrates.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 12A and 12B show flows of wafers to be processed in accordance with the preferred embodiment;

FIGS. 14(a) and 14(b) are a sectional view showing an example of conventional techniques.

DESCRIPTION OF THE PREFERRED EMBODIMENTS

A. Mechanical Structure

Figure 1:
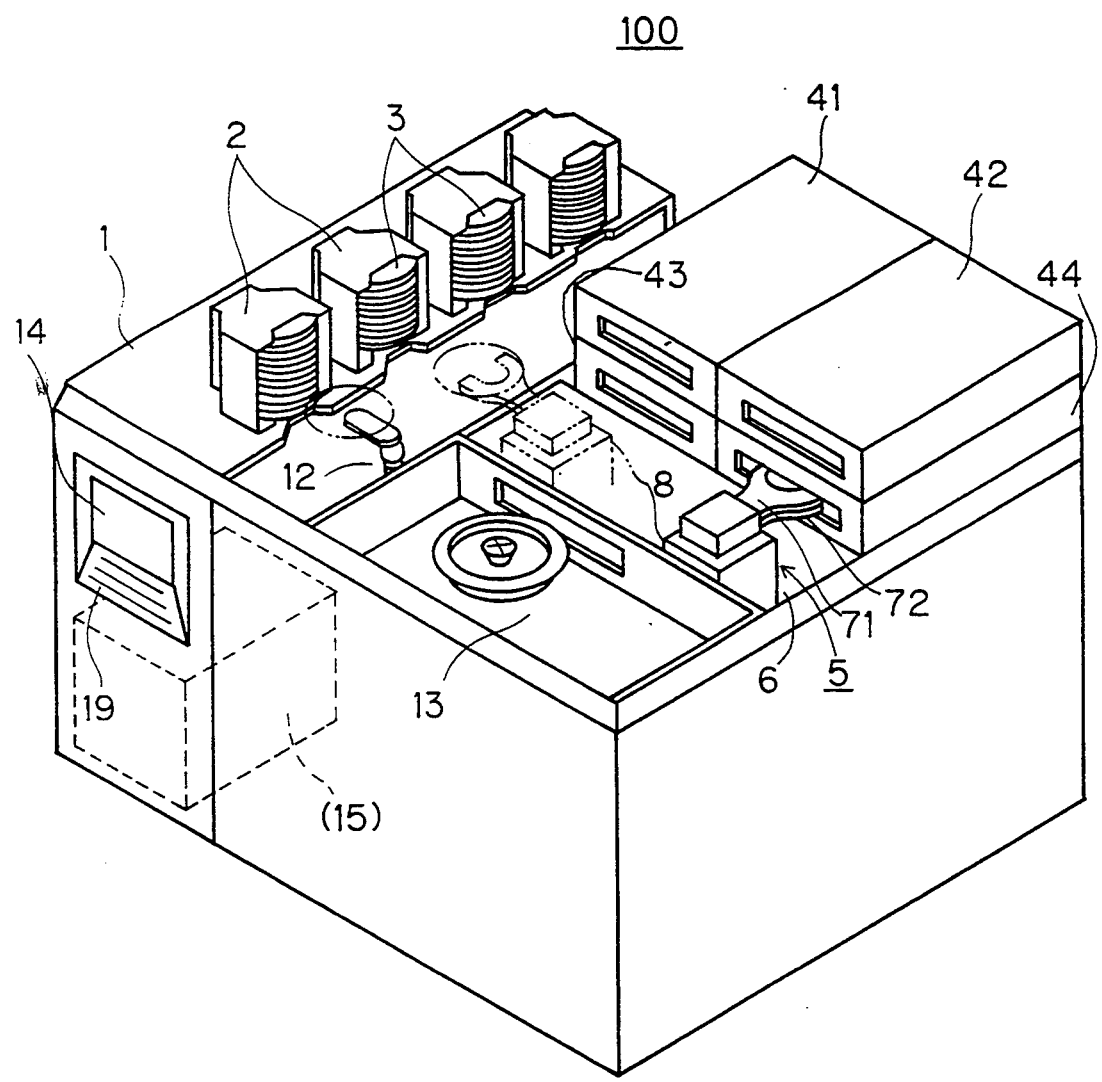
FIG. 1 is a perspective view showing a system for processing semiconductor substrates according to a preferred embodiment of the present invention.

FIG. 1 is a perspective view showing a system 100 for processing semiconductor substrates according to a preferred embodiment of the present invention.

Figure 13:
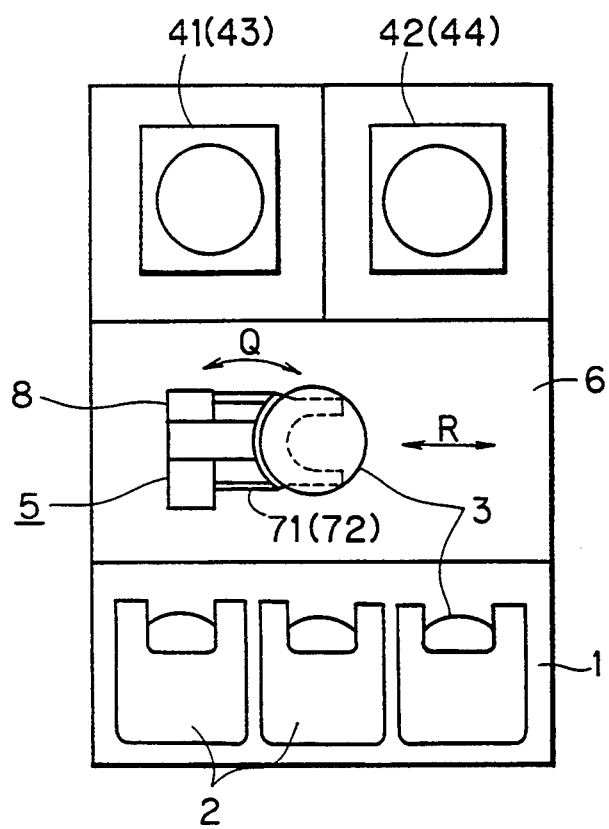
FIG. 13A is a schematic plan view showing a conception of a heat processor for semiconductor substrates.
FIG. 13B shows an order for transporting wafers.
Figure 13:
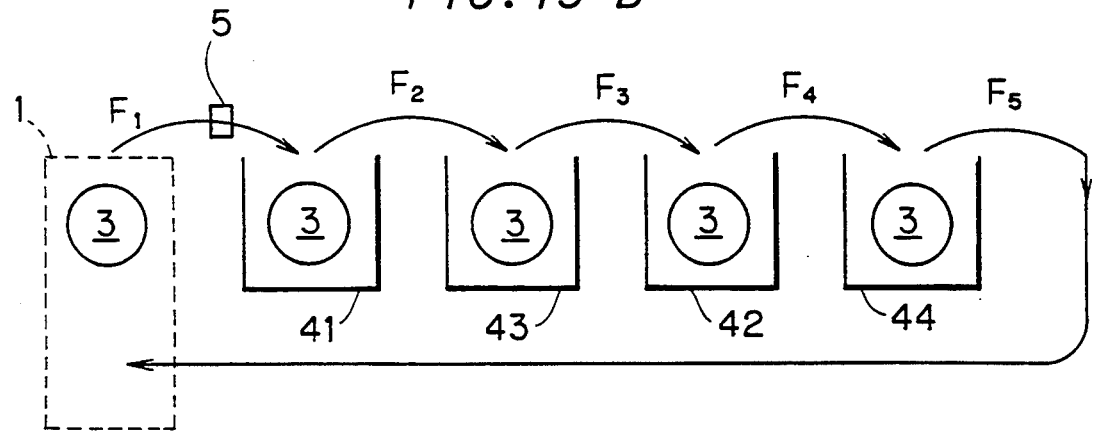

Similar to the heat processor shown in FIG. 13A, the system 100 comprises heat processing parts 41 and 42 as well as cool processing parts 43 and 44. Cassettes 2 to store wafers 3 are aligned on a indexer 1. A substrate transporting robot 5, which comprises arms 71 and 72 provided in two stages, i.e., upper stage and lower stage, respectively, is installed on a stage 6. A substrate transferring robot 12 is provided on the indexer 1. A coating processing part 13 is provided on the opposite side of the processing parts 41, 42, 43 and 44 across the stage 6. In this coating processing part 13, each wafer 3 is subjected to a coating processing to receive thereon a photoresist, for example.

Figure 2:
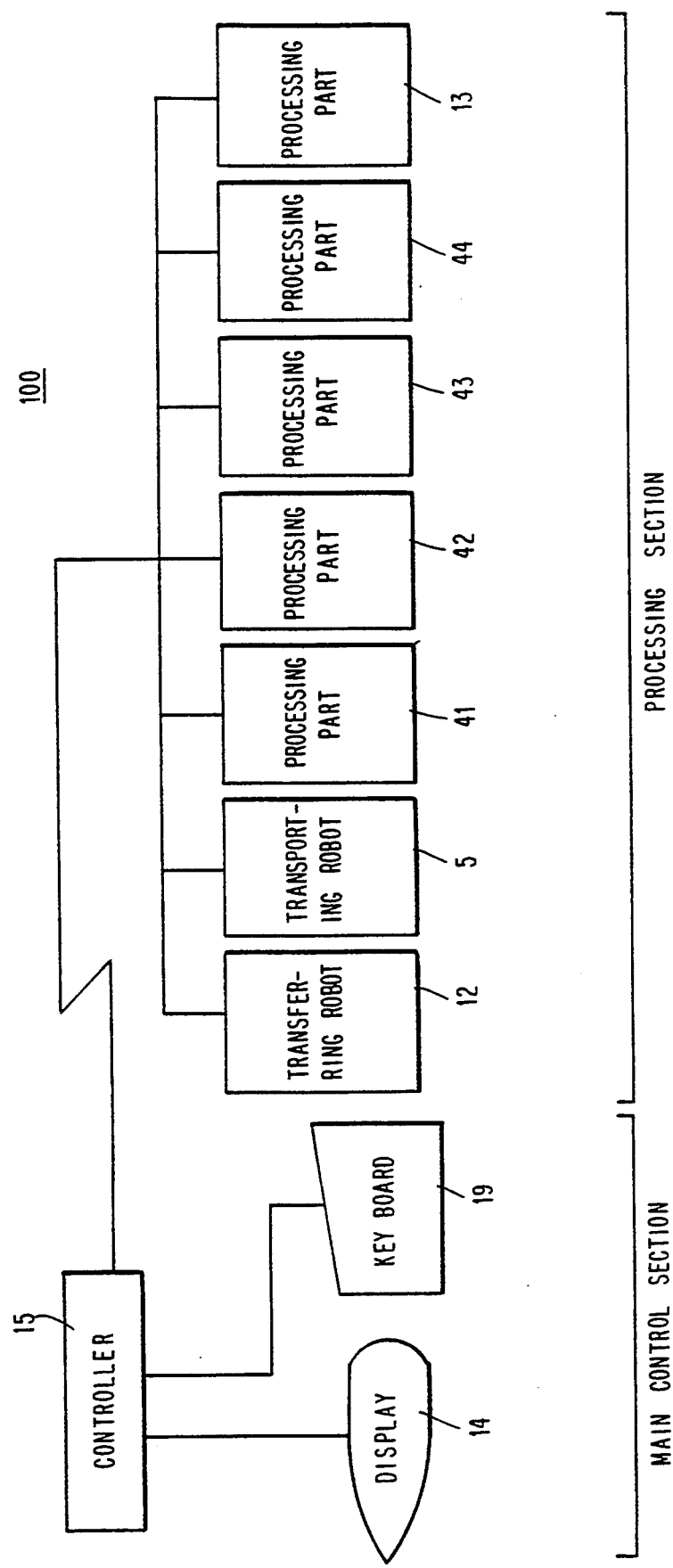
FIG. 2 is a block diagram showing the system shown in FIG. 1.

FIG. 2 is a block diagram of the system 100. A controller 15 is operable to control in input, setting, storage and other operations of various data for each processing part, the substrate transporting robot 5 and the substrate transferring robot 12. A key board 19 and a display 14 are employed as an input and output devices, respectively. According to the data inputted from the key board 19, the controller 15 conducts a processing, which will be more fully described later, to control the robots 5 and 12.

The controller 15 comprises a CPU, a memory for storing various data and software programs, and timer means for counting time for timing-control of the system 100.

B. Content of Process Sequence

Figure 3:
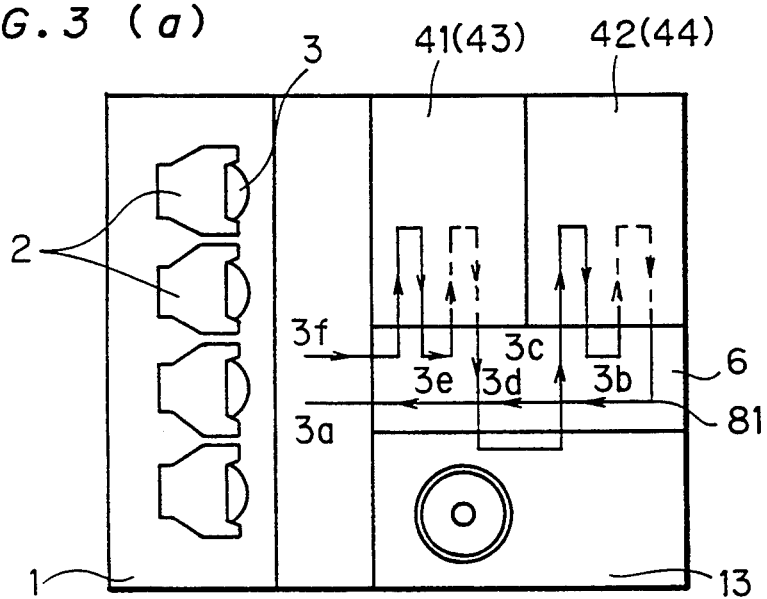
FIG. 3(a) is a schematic plan view showing a route of transporting a substrate employed in the system shown in FIG. 1.
FIG. 3(b) is a block diagram showing the route shown in FIG. 3(a)
Figure 3:
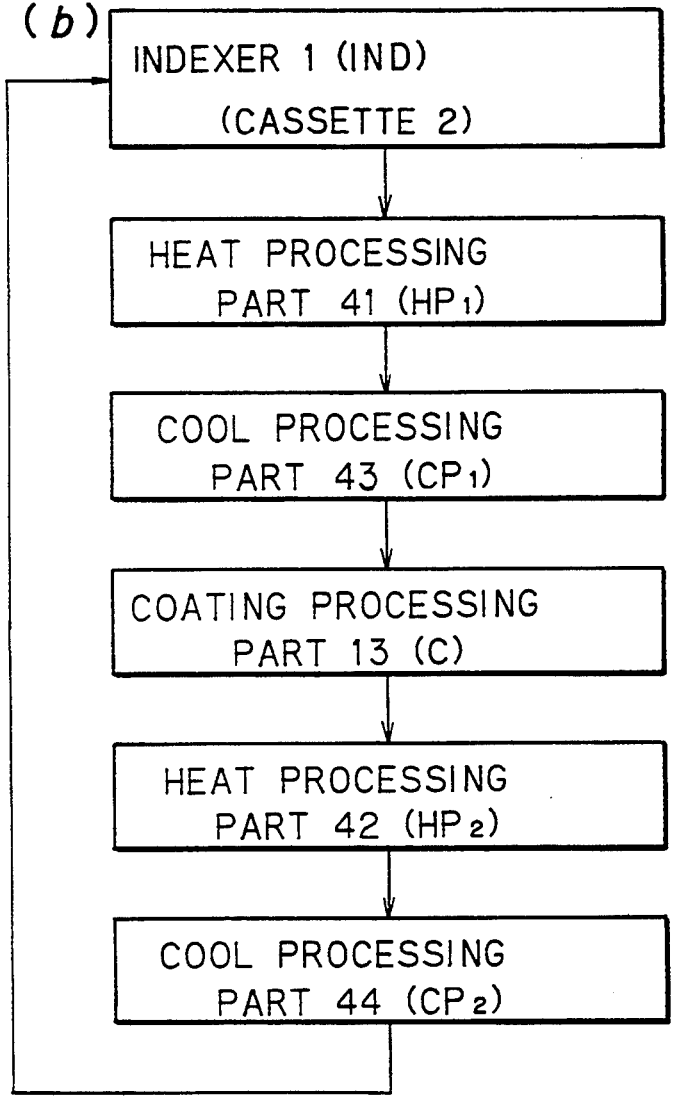

A transportation route of the wafer will be now schematically explained, referring to FIGS. 1, 3(a) and 3(b). A wafer 3f (see FIG. 3(a)) in the cassette 2, which has been in a waiting state for being processed, is put on the arm 71, for example, of the robot 5 via the transferring robot 12. The robot 5 moves to the heat processing part 41 by means of a moving mechanism 8 so that the arm 72 takes out a wafer 3e which has been processed in the processing part 41. The heat processing part 41 is emptied by this operation, whereby the arm 71 introduces the wafer 3f into the processing part 41.

The wafer 3e, which has been taken out of the heat processing part 41 and is held on the arm 72, is moved to the cool processing part 43 by means of a elevator mechanism (not shown) for the robot 5. After the arm 71 takes a wafer 3d out of the processing part 43, which wafer 3d has been processed in the cool processing part 43, the arm 72 introduces the wafer 3e into the processing part 43.

Similarly, the wafer 3d, 3c, 3b and 3a, which have been processed in the processing parts 43, 13, 42 and 44, respectively, are moved to the parts 13, 42, 44 and the cassette 2 in series, respectively. The movement of the robot 5 can be shown by an arrow 81. The robot 5 cyclically repeats this transportation movement so that wafers to be newly processed in each processing part are sent one after another to the respective processing parts 41, 43, 13, 42 and 44 in that order, while the processed wafers are sent back one after another to the cassettes 2 (see FIG. 3(b)).

The robot 5 transports the wafers 3 through the cyclic movement described above. Therefore, each wafer leaves the cassette 2, then is transported to the processing parts 41, 43, 13, 42 and 44, in that order, and finally returns to the cassette 2.

C. Analysis of Transportation Timing (Prior Art)

Figure 4:
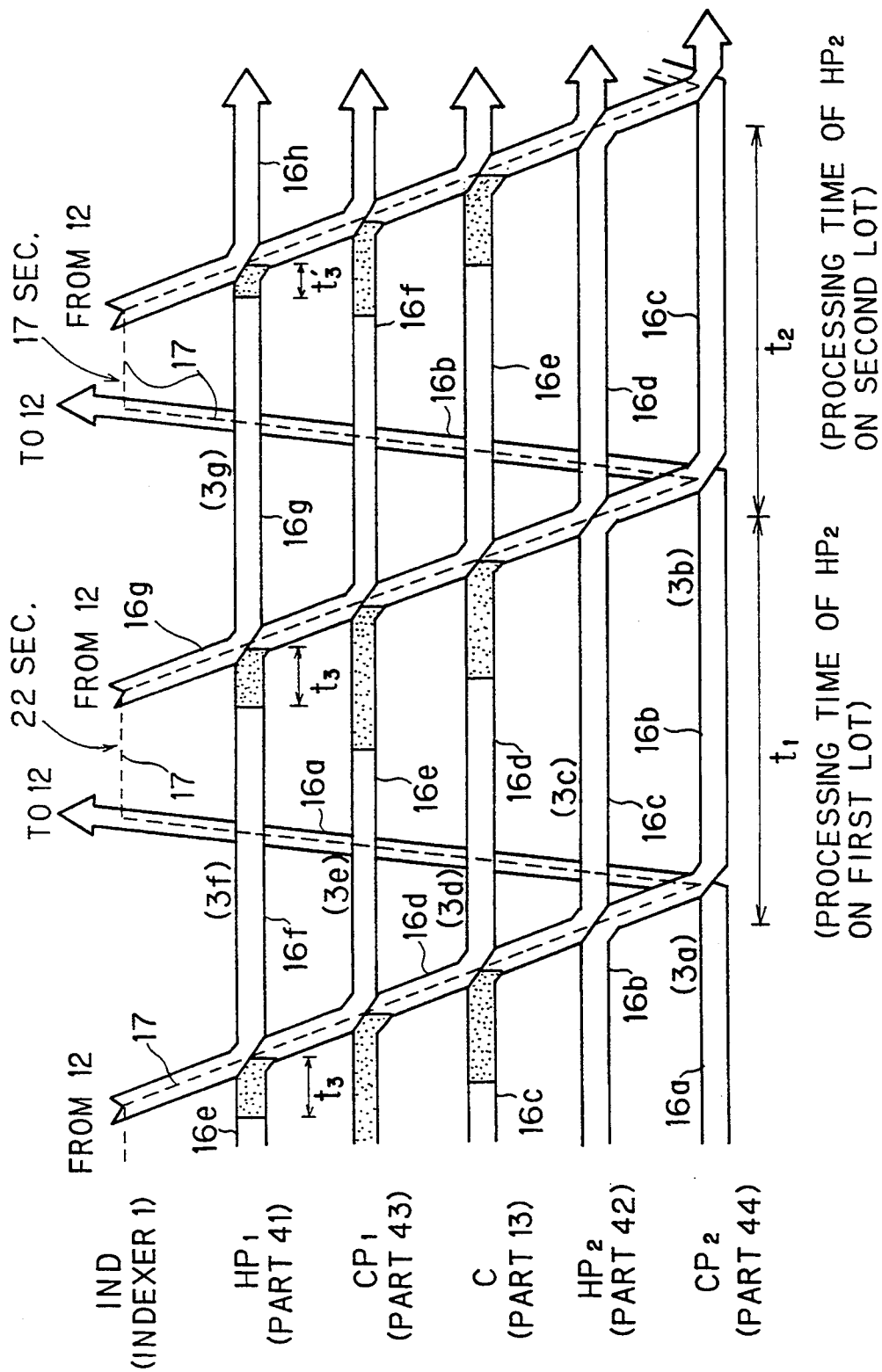
FIG. 4 shows flow of substrates to be processed with a conventional transporting method.

Before a control flow of the system 100 having the above-described transportation route in accordance with the preferred embodiment of the present invention is described, the problems which are liable to occur when a conventional method is applied to transportation of wafers will be analyzed, referring to a transportation diagram shown in FIG. 4. This analysis will make clear features of the method according to the preferred embodiment of the present invention. The symbols IND, $HP_1$, $CP_1$, C, $HP_2$ and $CP_2$ shown in the left-hand side of FIG. 4 represent the respective processings conducted in the indexer 1, the processing parts 41, 43, 13, 42 and 44, respectively. Void arrows 16a–16h represent respective flows of the processings conducted on the corresponding wafers. The arrows also indicate passage of time that is, FIG. 4 shows that time passes from the left-hand side to the right-hand side. A dashed line 17 represents the movement of the transporting robot 5. For example, the void arrow 16b represents the sequence of the processings conducted on the wafer 3b which has been already subjected to the processings IND, $HP_1$, $CP_1$ and C, in that order. The wafer 3b is subjected to the processing $HP_2$ and then, the wafer 3b is taken out of the processing part 42 and is transported to the processing part 44 to be introduced therein by the robot 5 which comes from the processing part 13 wherein the processing C is conducted. After the wafer 3b is subjected to the processing $CP_2$ in the processing part 44, it is transported to the indexer 1 by the robot 5 which comes from the processing part 42, wherein the processing $HP_2$ is conducted, so that the wafer 3b is subjected to the processing IND. The processing IND is a storage processing conducted by the transferring robot 12, by which the wafer 3b is stored in the cassette 2. Similarly, a void arrow 16f represents the processings conducted on the wafer 3f. As represented by the arrow 16f, the wafer 3f is taken out of the cassette 2, is subjected to the processings $HP_1$ and $CP_1$, in that order, and is transported to the processing part 13 wherein the processing C is conducted.

Figure 5:
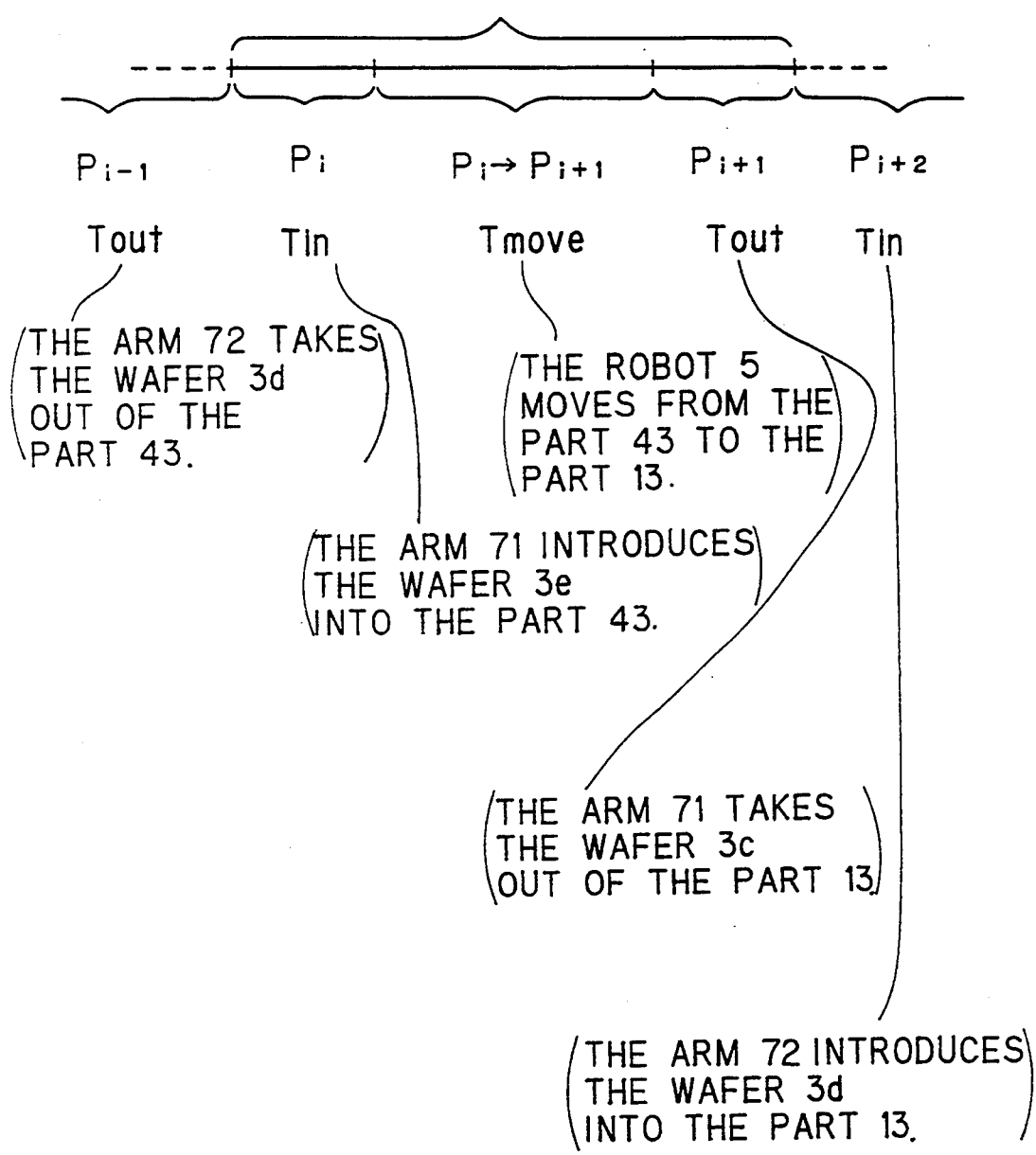
FIG. 5 is an explanatory view illustrating a transportation time.

Transportation time required for the transportation operation of the robot 5 includes the time necessary to take a wafer out of each processing part as well as the time necessary to take another wafer therein. FIG. 5 conceptually illustrates the transportation time. In FIG. 5, the symbol $P_i$ represents each of the processings IND, $HP_1$, $CP_1$, C, $HP_2$ and $CP_2$. The symbol $P_{i-1}$ represents a processing preceding the processing $P_i$, while the other symbol $P_{i+1}$ represents a processing following the processing $P_i$. The transportation time between the processings $P_i$ and $P_{i+1}$ is the sum of a time $T_{in}$ required for the arm 71 or 72 to take a wafer in a processing part in which the $P_i$ processing is conducted, a time $T_{move}$ required for the moving mechanism 8 to move the robot 5 between two processing parts and a time $T_{out}$ required for the arm 71 or 72 to take another wafer out from the processing part wherein the processing $P_{i+1}$ is conducted.

For example, the transportation time necessary for transporting the wafer 3d from the processing part 43 to the processing part 13 is the sum of:

the time $T_{in}$ required for the arm 71 or 72 to introduce the wafer 3e, which has been contained in the processing part 41, into the processing part 43;

the time $T_{move}$ required for the robot 5 to move from the processing part 43 to the processing part 13; and the time $T_{out}$ required for the arm 71 or 72 to take the wafer 3c, which has been contained in the processing part 13, out of the processing part 13.

The times $T_{in}$, $T_{move}$ and $T_{out}$ are 2 seconds, 4 seconds, and 2 seconds, respectively, and therefore, the transportation time is $2+4+2=8$ seconds. After the wafer 3c is taken out of the processing part 13, the wafer 3d is took in the processing part 13 by the arm 72 or 71. The time required for this operation by the arm 72 or 71 is included in the transportation time between the processing part 13 and the processing part 42.

In the following description, the term "a transportation time" is so used as to include the respective times necessary to take a wafer in and out of each processing part as well as the time necessary to transport a wafer from one processing part to the next processing part.

Figure 6:
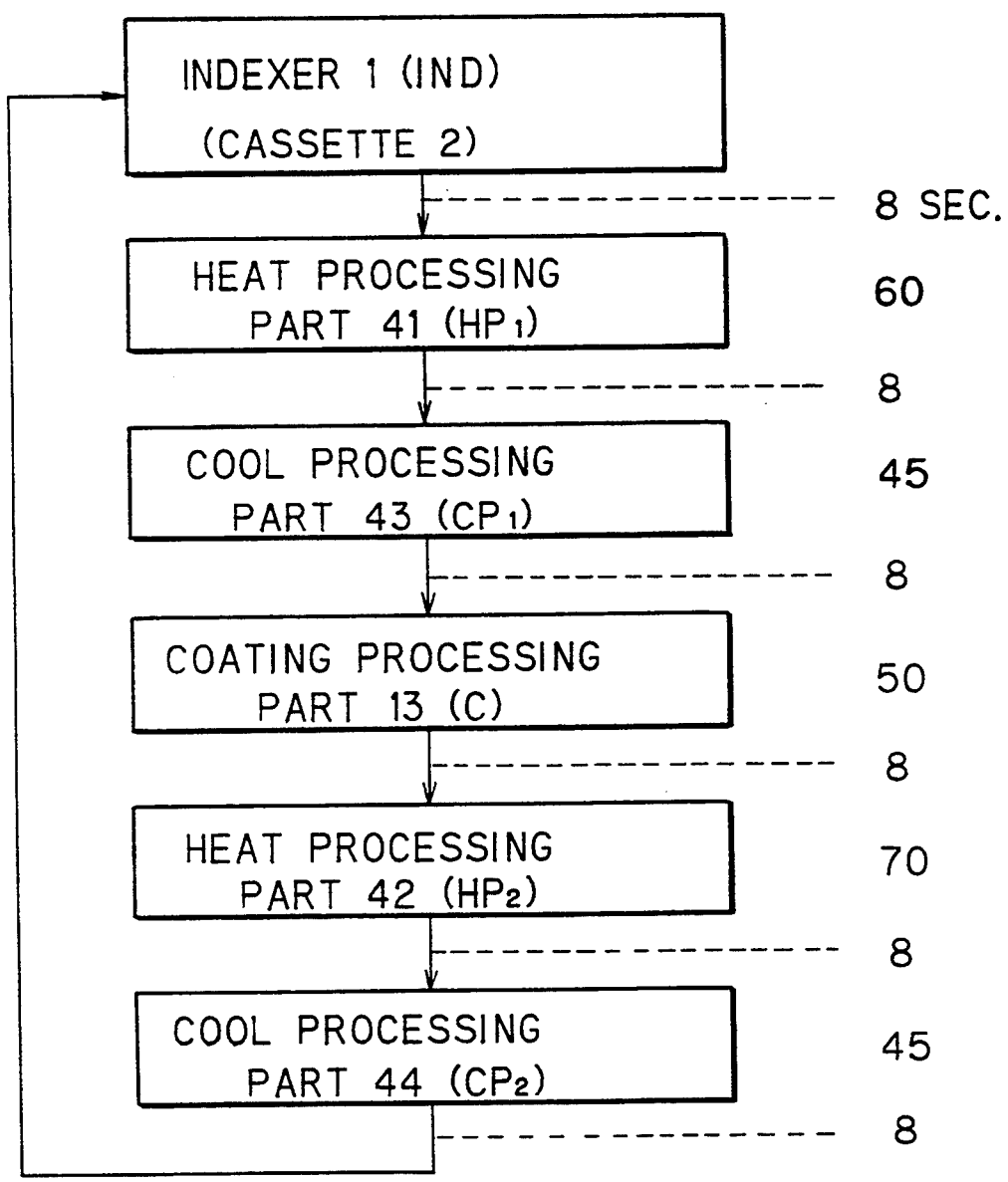
FIG. 6 illustrates movements of a robot 5 according to the preferred embodiment.

Similarly to FIG. 3(b), FIG. 6 schematically illustrates the transportation route of wafers. Every transportation equally requires 8 seconds. The processing times required for the processings $HP_1$, $CP_1$, C, $HP_2$, and $CP_2$ are 60 seconds, 45 seconds, 50 seconds, 70 seconds and 45 seconds, respectively. The total transportation time is 8 seconds×6=48 seconds. It is understood that the longest processing time, i.e., 70 seconds for the $HP_2$ processing, determines the rate of the cyclic flow of the processings.

Referring to FIG. 4 again, it can be seen from the arrow 16f which represents the flow of the wafer 3f that when the robot 5 reaches the processing part 41 as represented by the dashed line 17, $t_3=10$ seconds has already past since the processing $HP_1$ of 60 seconds in the processing part 41 had been completed. The wafer 3f is thus overheated for $t_3=10$ seconds. This is due to the processing $HP_2$. As shown by the arrow 16c, the processing $Hp_2$ is necessary to be conducted on the wafer 3c for $t_1=70$ seconds. Therefore, the time when the robot 5 leaves the indexer 1 for the processing part 42 is appropriately adjusted so that the robot 5 reaches the processing part 42 exactly when the required processing time $t_1=70$ seconds has past since it left the indexer 1. The robot 5 has to wait for 70 seconds—(8 seconds×6)=22 seconds at the indexer 1, and as a result, it reaches the processing part 41 ten ($t_3=10$) seconds later after the processing of 60 seconds in the processing part 41 is completed.

The robot 5 is not necessary to wait for 22 seconds at the indexer IND. However, as long as the transportation procedure shown in FIG. 6 is followed, the processing time required for the processing $HP_2$, i.e., 70 seconds, determines the rate of the cyclic procedure, and therefore, it is necessary to provide a waiting time of 22 seconds somewhere.

Figure 15:
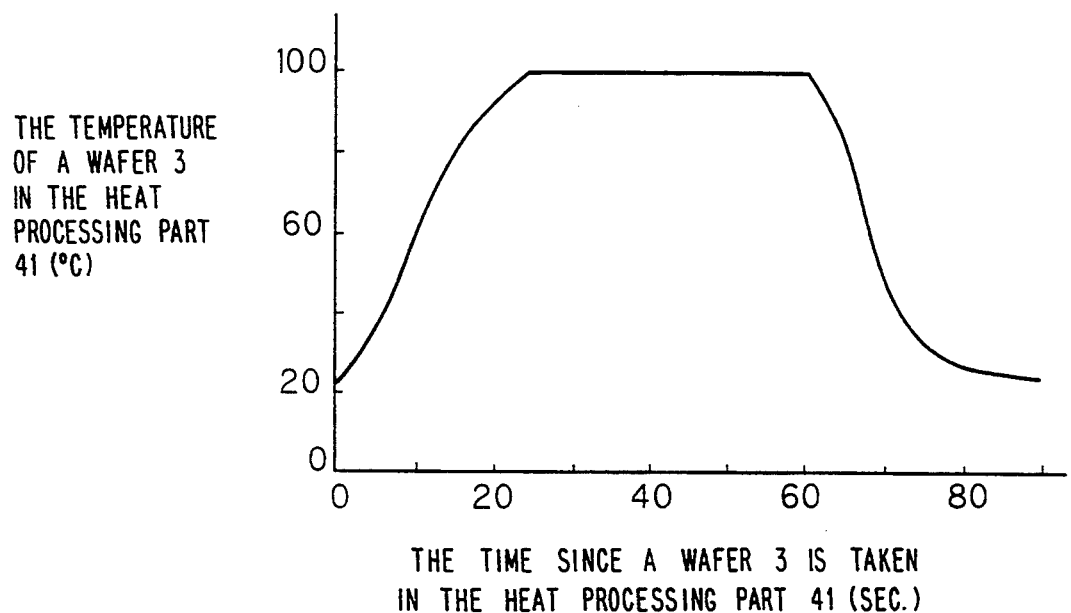
FIGS. 15(a) and 15(b) illustrate temperature curve in a heat processing.
Figure 15:
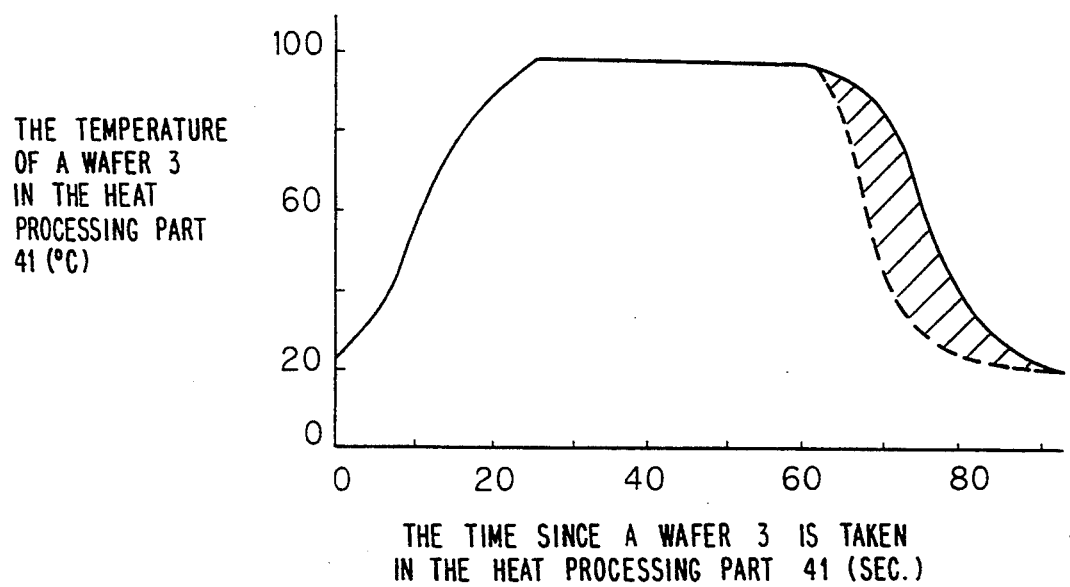

The delay times are represented by dotted portions in FIG. 4. Among these delay times, particularly the delay time $t_3$ in the processing $Hp_1$ brings the most significant problem. This is because, as was already described above in reference to FIG. 15, an excess heat processing causes a harmful effect on patterning accuracy of a photoresist.

Furthermore, when plural lots of wafers are continuously processed and different processing times are required in respective lots, the delay time $t_3$ itself varies within each lot. For example, supposed is the case where the wafers 3a, 3b and 3c are included in a lot requiring 70 seconds in the processing $HP_2$ and the wafers 3d, 3e, 3f, ... are included in another lot requiring 65 seconds in the processing $HP_2$. The arrow 16d represents the flow of the processings conducted on the wafer 3d, which is the first wafer in the latter lot which is to be subjected to the processing $HP_2$ for $t_2=65$ seconds.

In order to conduct the processing $HP_2$ on the wafer 3d for 65 seconds, the waiting time of the robot 5 at the indexer 1 becomes five-seconds=(70−65 seconds) shorter than the last waiting time, i.e 22 seconds. That is, the robot 5 waits at the indexer 1 for 17 seconds before it moves to the processing part 41. Therefore, the robot 5 arrives at the processing part 41 to take the wafer 3g 65 seconds after the robot 5 left there last time. The delay time $t_3$ in the processing $HP_1$ is now reduced to $t_3'$ by 5 seconds in accordance with the reduction in the processing $HP_2$ by 70−65=5 seconds. This reduction in the delay time $t_3$ to $t_3'$ affects only the wafer 3g and the wafers following the wafer 3g among the chain of wafers 3d, 3e, 3f, 3g, ... which belong to the same lot. The wafers 3d, 3e and 3f have been already processed in the processing $HP_1$ when the reduction in the delay time $t_3$ is caused, and the reduction in the delay time does not affect the processing $HP_1$ on the wafers 3d, 3e and 3f. As a result, the wafers 3d, 3e and. 3f are subjected to heat processing $HP_1$ through a temperature curve different from other wafers 3g, ... In the case where first and second lots are provided and twenty five wafers are contained in each lot, the leading three wafers in the second lot are subjected to the heat processing by the longer time than the following twenty two wafers. As a result, important control parameters such as critical exposure or the like vary within each lot, which brings a serious problem.

The same problem is caused also in the first lot. Since no lots are present prior to the first lot, the processings $HP_2$ and $CP_2$ are not started yet during the time leading three wafers in the first lot are sequentially subjected to the processing $HP_1$. Thus, the cyclic processings in this initial time period are imperfect ones excluding the processings $HP_2$ and $CP_2$, so that the rate of the cyclic processings is determined as a function of the processing $HP_1$ rather than the processings $HP_2$. Accordingly, the robot 5 can come back to the processing part 41 at a desired time, that is, 60 seconds after the processing HP started in the part 41. When the $HP_2$ processing is started in response to delivery of the fourth wafer to the processing path, the rate of the cyclic processings comes to depend on the processing $HP_2$ which requires the longest processing time of 70 seconds. Thus, only the first three wafers, among wafers contained in the same lot, do not receive an excess heat processing. These three wafers therefore are subjected to the heat processing through a different temperature curve from the other twenty-two wafers even though they both are contained in the same lot.

D. Control Flow (Preferred Embodiment)

These undesirable results described above can be avoided by:

(1) driving the robot 5 along the cyclic processing path under a single constant cycle time not only in the steady states but also in the transition periods; and (2) delaying the starting time of the processing $HP_1$ by a time corresponding to the time $t_3$ or $t_3'$ so that the processing $HP_1$ is terminated just when the robot 5 returns to the processing part 41.

According to the preferred embodiment of the present invention, the robot 5 holding a wafer is controlled to wait for a time corresponding to the time $t_3$ or $t_3'$ just before the processing part 41, and then to introduce the wafer into the processing part 41 for the processing $HP_1$.

Figure 7:
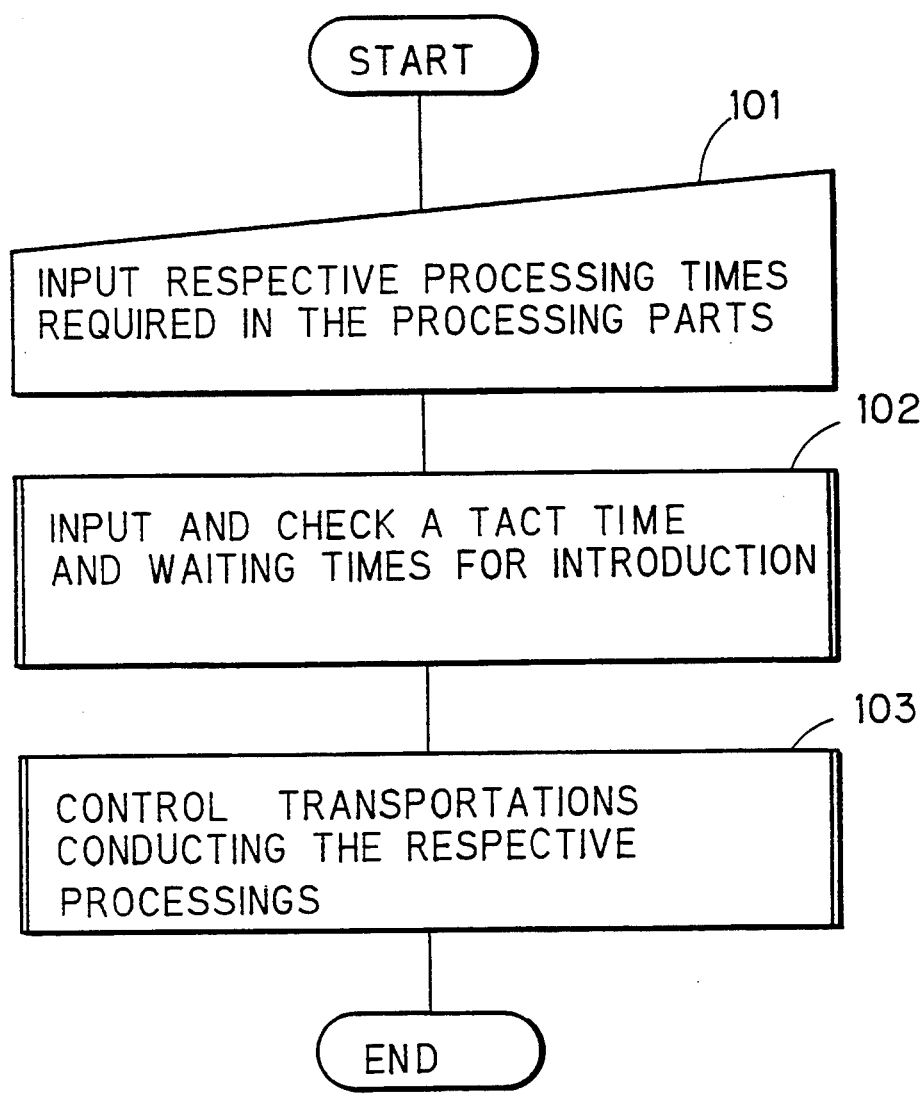
FIG. 7 is a flow chart showing an overall flow of the method of transporting a substrate in accordance with the preferred embodiment.

FIG. 7 shows an overall flow of the method of transporting a substrate in accordance with the preferred embodiment of the present invention. In the first step 101, respective processing times required in the processing parts are inputted through the key board 19, or the like. The respective processing times of the processing parts in accordance with the preferred embodiment are determined as shown in Table 2.

TABLE 2

| | |
|---|---|
| Processing Time of $HP_1$ Processing on First Lot | $T_1$ = 60 seconds |
| Processing Time of $CP_1$ Processing on First Lot | $T_2$ = 45 seconds |
| Processing Time of C Processing on First Lot | $T_3$ = 50 seconds |
| Processing Time of $HP_2$ Processing on First Lot | $T_4$ = 70 seconds ($= t_1$) |
| Processing Time of $CP_2$ Processing on First Lot | $T_5$ = 45 seconds |
| Processing Time of $HP_1$ Processing on Second Lot | $T_6$ = 60 seconds |
| Processing Time of $CP_1$ Processing on Second Lot | $T_7$ = 45 seconds |
| Processing Time of C Processing on Second Lot | $T_8$ = 50 seconds |
| Processing Time of $HP_2$ Processing on Second Lot | $T_9$ = 65 seconds ($= t_2$) |
| Processing Time of $CP_2$ Processing on Second Lot | $T_{10}$ = 45 seconds |

Each of the respective processing times in these processing parts corresponds to the time which passes from when a wafer is introduced in the objective processing part until when the wafer is taken out thereof. Each of the processing times therefore includes a taking-in time $T_{in}$ of a wafer as well as a taking-out time $T_{out}$ of a wafer. In other words, the taking-in time $T_{in}$ and the taking-out time $T_{out}$ constitute a part of the transportation time of the robot 5 as shown in FIG. 5, while they are also a part of the processing time of each processing part. The processing time of each processing part consists of these times $T_{in}$ and $T_{out}$ and the net processing time for substantially conducting the net processing. For example, the processing time in the processing part 13 for photoresist-coating consists of the times $T_{in}$ and $T_{out}$ and the next time for applying a photoresist to a wafer.

The transportation time $T'$ between the respective processing parts are determined on the basis of moving performance of the robot 5, a distance between two adjacent processing parts and the like, and may be inputted through the keyboard 19 before starting the processings or may be previously set as a default value. For example, the value of 8 seconds is inputted as the transportation time $T'$, which value is obtained as a function of the time necessary for the robot 5 to move the maximum one among the distances between respective two adjacent processing parts along the processing path and to exchange wafers in the latter processing part in the adjacent two processing parts.

In the next step 102, inputted, and checked are respective values designating a cycle time and "waiting times for introduction". The "waiting times for introduction" are defined as times for waiting for introducing a wafer into respective processing parts. The cycle time and the waiting times for introduction will be more fully described later. In the next step 103, the cycle time and the waiting times for introduction are employed for controlling transportations and for conducting the respective processings in the processing parts.

Figure 8:
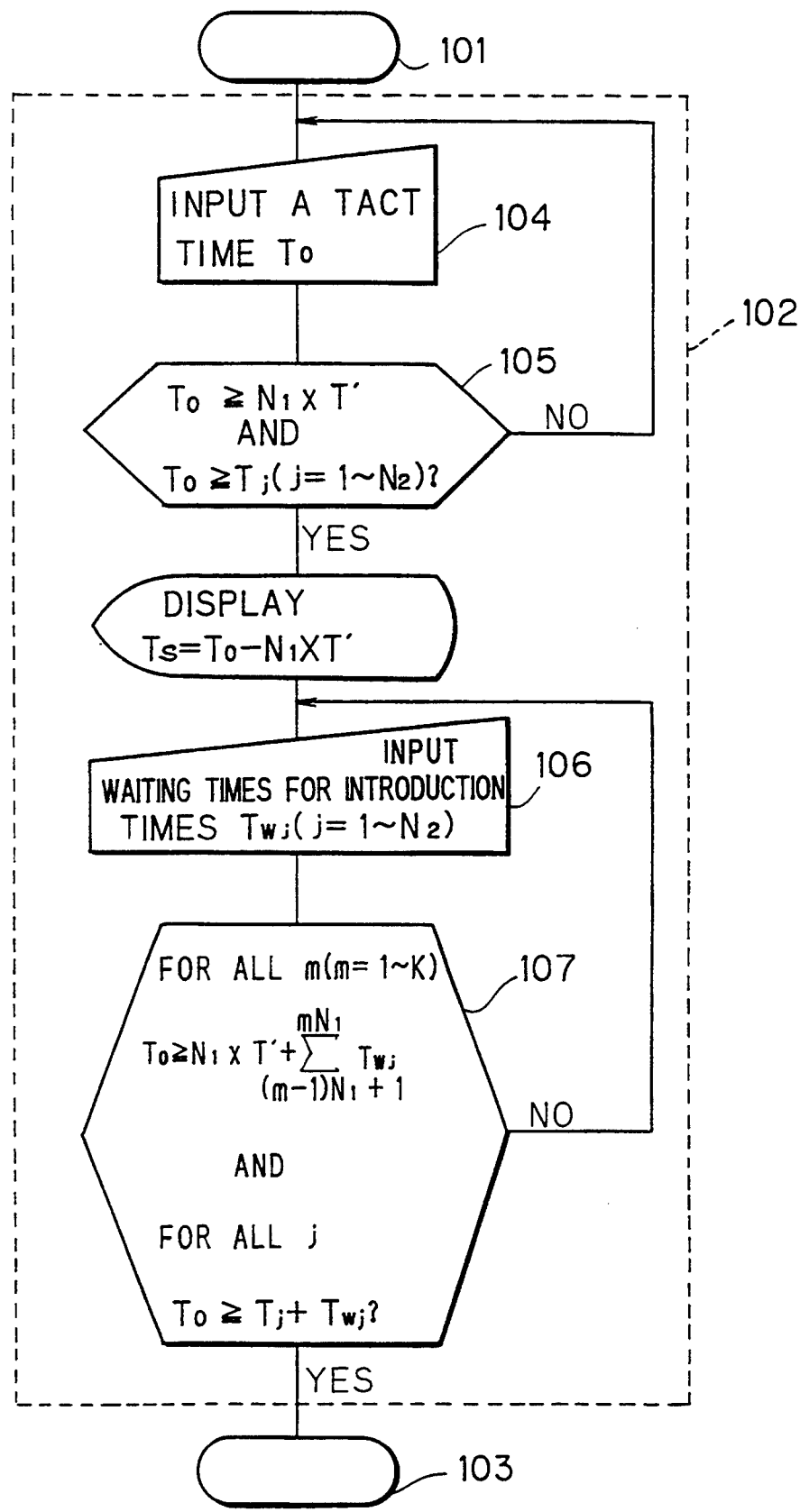
FIGS. 8 to 11 are flow charts showing a partial flow of the method of transporting a substrate in accordance with the preferred embodiment.

More details of the step 102 are now described, referring to FIG. 8. A value designating the cycle time $T_0$ is inputted through the keyboard 19 in the step 104. Previously, the restriction of the cycle time $T_0$ according to other parameters may be shown in the step 101 to help inputting the cycle time $T_0$. In the next step 105, the cycle time $T_o$ is compared with a circulation time $T_c$ of the robot 5. The circulation time $T_c$ is the time required for the robot 5 to circulate the processing path or loop and is calculated as:

$$T_c = N_1 \times T' \qquad (1)$$

where $N_1$ is the total number of the processing parts and is "5" in the example shown in the Table 2.

Further, the cycle time $T_0$ is compared with each of the processing times $T_j$ (j=1 to $N_2$) designated for respective processing parts with respect to different sets of processing times, where $N_2$ is defined as:

$$N_2 = k \times N_1 \qquad (2)$$

and $\underline{k}$ is a positive integer representing the number of different sets of processing times. In the example shown in Table 2, the number of the processing parts $N_1$ is five and there are two different sets of processing times. The first set of processing times ($T_1, T_2, \ldots T_5$) are for the first lot of wafers and the second set of processing times ($T_6, T_7, \ldots T_{10}$) are for the second lot of wafers. Thus, obtained are:

$$N_1 = 5 \qquad (3)$$

$$k = 2 \qquad (4)$$

$$N_2 = 2 \times N_1 = 10 \qquad (5)$$

The following processings are conducted only when the tract time $T_0$ is equal to or longer than the respective values of $T_j$ (j=1 to $N_2$) and $T_c$, i.e., $$T_0 \geq T_c \text{ and } T_0 \geq T_j \text{ (j=1 to } N_2\text{)} \qquad (6)$$

When the cycle time $T_0$ is shorter than the circulation time $T_c = N_1 \times T'$ and/or the respective processing times $T_j$, it is impossible to provide a finite waiting time for introduction because there is no additional time for the robot 5 to spare before introducing a wafer into a processing part. When an inadequate cycle time $T_0$ not satisfying the condition (6) is inputted, a warning is displayed on the display 14 and a new value designating a new cycle time $T_0$ is inputted. The new cycle time should be longer than the old cycle time. This is because, if a new cycle time shorter than the old cycle time were inputted, the condition (6) would not be satisfied again.

Input of a cycle time is repeated until the condition (6) is satisfied, and when a cycle time satisfying the condition (6) is obtained, the cycle time $T_0$ is set in common for all wafers in respective lots, i.e., the first and second lots in the example now considered. This cycle time $T_0$ is used for defining a time period in which the robot 5 circulates the processing loop for one round while serially transporting and exchanging wafers in respective processing parts. The cycle time $T_0$ is set in common to a steady state and transition states of the processings.

The steady state is such a period in which a train of wafers are progressing along the processing path without changing the sequence of processings. The transition states include an initial state and a terminating state. The initial state is such a state in which the leading wafer of a lot is being processed in the processing path. The terminating state is a state that the end wafer in a lot enters the processing path. Due to step 105, the following condition (7) is applied to the cycle time $T_0$.

$$T_0 \geq \max(T_1, \ldots T_{Nn2}, T_c) \quad (7)$$

Preferably, the cycle time $T_0$ is selected in accordance with the condition (8).

$$T_0 = \max(T_1, \ldots T_{N2}, T_c) \quad (8)$$

In the example now considered, the cycle time $T_0$ is determined as:

$$\begin{aligned} T_0 &= \max(T_1, \ldots T_{N2}, T_c) \\ &= \max(T_1, \ldots T_{n2}, N_1 \times T') \\ &= t_1 \\ &= 70 \text{ seconds} \end{aligned} \quad (9)$$

In the next step 106, values representing the respective waiting times $T_{wj}$ (j=1 to $N_2$) for introduction to respective processing parts are inputted. As described above, the respective waiting times $T_{wj}$ must be equal to or shorter than the time $T_s$ which is obtained by subtracting the circulation time from the cycle time, i.e, $$T_{wj} \leq T_s = T_0 - T_c \quad (j=1 \text{ to } N_2) \quad (10)$$

If the time $T_{wj}$ is longer than the value $T_s$, the robot 5 can not circulate through all the processing parts within the cycle time $T_0$. In order to direct the operator's attention to the condition (10), the value $T_s$ is displayed on the display 14 before entering the step 106. An additional condition for determining $T_{wj}$ is provided in the next step 107, which is more severe than the step 105.

What is judged in the step 107 is whether the cycle time $T_0$ is longer or shorter than the sum $U_m$ of the circulation time $T_c = N_1 \times T'$ and the total waiting time $S_m$ for introduction in respective processings on a certain lot represented by m. Further, it is also judged whether the cycle time $T_0$ is equal to or larger than the sum $V_j$ of the processing time $T_j$ and the waiting time $T_{wj}$ for j=1, 2, ... $N_2$.

That is calculated are:

$$U_m = T_c + S_m \quad (11)$$

$$S_m = \sum_{j=(m-1)\cdot N_1 + 1}^{m \cdot N_1} T_{wj} \quad (12)$$

$$V_j = T_j + T_{wj} \quad (13)$$

and then, judged is whether all of:

$$T_0 \geq U_m = T_c + S_m \quad (14)$$

$$T_0 \geq V_j = T_j + T_{wj} \quad (15)$$

are satisfied or not, where m=1 to k and j=1, 2 ... $N_2$.

This condition (14) is required for the same reason as that described in reference to the step 106, however, the condition (14) in the step 107 is more severe than the condition (6) in the step 105 since the right hand side of the expression (14) includes the sum $S_m$ of the values $T_{wj}$ satisfying the condition $T_{wj} \geq 0$ in addition to the value $T_c$.

When the conditions (14) and (15) are not satisfied, new values for $T_{wj}$ are inputted and this process is repeated until values of $T_{wj}$ satisfying the conditions (14) and (15) are found.

Preferably, the waiting times $T_{wj}$ are determined so that the conditions:

$$T_0 = U_m = T_c + S_m \quad (16)$$

$$T_0 = V_j = T_j + T_{wj} \quad (17)$$

are satisfied.

In the example now considered, inputted are the values of $T_{wj}$ indicated in the following equations (18) to (21). It is easily confirmed that the values of $T_{wj}$ in the equations (18) to (21) satisfy the conditions (14) and (15) required in the step 107.

$$T_{w1} = T_0 - T_1 = t_3 = 10 \text{ seconds} \quad (18)$$

$$T_{w6} = T_0 - T_6 = t_3 = 10 \text{ seconds} \quad (19)$$

$$T_{w9} = T_0 - T_9 = t_3' = 5 \text{ seconds} \quad (20)$$

$$T_{wj} = 0 \text{ second } (j \neq 1, 6, 9) \quad (21)$$

In other words, the longest one, among the circulation time $T_c = N_1 \times T'$ and the processing times $T_j$ (j=i, 2, ..., $N_2$) of all the processing parts, is chosen as a maximum time $T_{max}$. Then the cycle time $T_0$ is chosen so as to satisfy the condition:

$$T_0 \geq T_{max} \quad (22)$$

When there are processing parts at which the robot 5 has to wait for taking a wafer therein, a waiting time:

$$T_{wj} = T_0 - T_j \quad (23)$$

is provided for each of these processing parts so that the condition of the present invention can be satisfied. The calculation in the step 102 may be conducted by the controller 15.

Preferably, finite values are given only to the waiting times $T_{wj}$ for the heating processing parts. The expressions (20) and (21) correspond to the preferable case.

Figure 9:
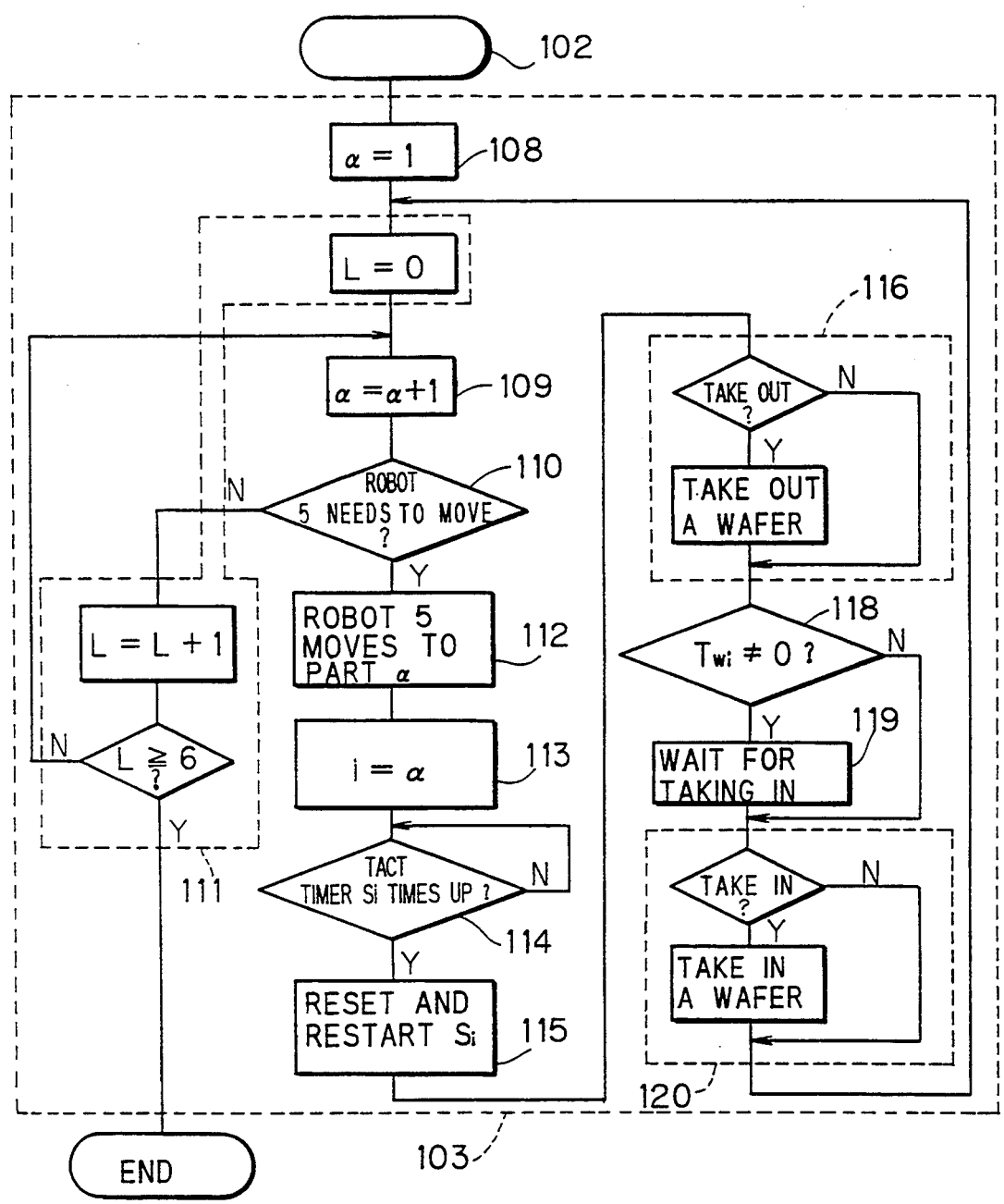

Details of the step 103 shown in FIG. 7 will now be described, referring to FIG. 9. In FIG. 9, the symbol i represents the i-th processing part, and the indexer 1 is one of these processing parts. According to the preferred embodiment, correspondences between i and the respective processing parts are as follows:

| | | |
|---|---|---|
| i = 1 + 6n | Indexer 1 | |
| i = 2 + 6n | Heat processing part 41 | (Processing HP$_1$) |
| i = 3 + 6n | Cool processing part 43 | (Processing CP$_1$) |
| i = 4 + 6n | Coating processing part 13 | (Processing C) |
| i = 5 + 6n | Heat processing 42 | (Processing HP$_2$) |
| i = 6 (n + 1) | Cool Processing part 44 | (Processing CP$_2$) | wherein n is zero or a natural number.

The symbol α shown in the step 108 represents the processing part in which the robot 5 is positioned at the moment, and correspondences between α and the respective processing parts are the same as those between i and the respective processing parts.

In the step 109, a number α+1 is given as a new value of α for designating the processing part which follows the processing part in which the robot 5 is positioned at the moment. In the step 110, it is judged whether or not there is a need for moving the robot 5 to the processing part α. For example, after the first wafer is introduced in the processing part 41 for the processing HP$_1$, there is not a need of moving the robot 5 to the processing part 43 for the processing $CP_1$. Therefore, the processing is proceeded to a termination routine 111, which will be more fully described later.

When there is a need of transporting the wafer to the processing part for the α-th processing, the robot 5 moves to the α-th processing part (the step 112), and the number i is defined by the number α in the step 113. A cycle timer $S_i$ in the step 114 is a timer provided for the i-th processing part, and the cycle time $T_0$ is set in the cycle timer $S_i$. In the step 114, the robot 5 waits at a position fronting on the i-th processing part until the cycle timer $S_i$ times up. In the step 115, the cycle timer $S_i$ is reset and restarted when the cycle time $T_0$ has passed and the cycle timer $S_i$ times up. In response to the timing-up of the timer $S_i$, the processing in the i-th processing part is started. The counting of time from zero to $T_0$ is repeated in the timer $S_i$, so that the processing in the i-th processing part is repeated at intervals of the cycle time $T_0$.

In order to avoid complicating FIG. 9, the operation of the cycle timer $S_i$ in the case where the first wafer is processed is not shown in FIG. 9. In this case, a cycle timer $S_1$ for the indexer 1 times up immediately, and the wafer is transported to the processing part 41 for the processing $HP_1$ at once. The cycle timers for the following processing parts are not enabled to count the cycle time $T_0$ because the step 115 of these processing parts have not conducted yet. Therefore, these cycle timer stated are so designed that these cycle timers in the initial state time up when the waiting time and the transportation time have passed since the robot 5 started to take the wafer out of the preceding processing part.

In the step 116, if there is a wafer already in the i-th processing part, this wafer is taken out thereof. In the step 118, it is judged whether a finite waiting time for introduction of the wafer is provided for the current processing part. If provided, the robot 5 spends the waiting time in front of the i-th processing part while waiting for taking the wafer therein, in the step 119. Then, the robot 5 takes the wafer in the i-th processing part in the step 120. By repeating the process described above, the transportation of wafers along the processes path is controlled using the cycle time $T_0$ and the waiting times $T_{wj}$.

The termination routine 111 is provided for terminating the transportation in the, case where there is no more processing to be conducted in any processing parts. In the terminating routine 111, it is judged whether or not the robot 5 needs to further move to a processing part. This judgement is carried out one after another for the respective processing parts following the current position of the robot 5. The operation of the system is terminated when a parameter L becomes "6" and it is indicated that no further processing to be conducted remains.

With the operation flow described above, an excess heat processing at the processing $HP_1$ can be avoided. How the excess heat processing can be avoided will be described with reference to FIG. 12A, in which flows the wafers 3a–3h are represented by arrows 16a–16h, respectively.

After the robot 5 takes a wafer 3f out of the indexer 1 (α−1), the robot 5 moves to the processing part 41 (α=2) in the steps 109, 110 and 112. The current position (i=2) is resistered in the step 113. The cycle timer $S_2$ for the processing part 41 times up when the robot 5 arrived at the processing part 41. Therefore, the timer is reset and starts (the steps 114 and 115). Since the heat processing on a wafer 3e which is in the processing part 41 has been completed, the wafer 3e has to be taken out thereof. In the step 116, therefore, the wafer 3e is taken out of the processing part 41 at a time A shown in FIG. 12A.

According to the conventional transportation method, the wafer 3f is immediately introduced in the processing part 41. According to the preferred embodiment of the present invention, on the other hand, there is provided a waiting time 18a for taking the wafer therein. Specifically, it is found in the step 188 that a finite waiting time is provided to the processing part 41 for the processing $HP_1$. Then, the robot 5 waits in the step 119 for taking the wafer therein for a time corresponding to the difference $t_3=(70-60)$ seconds=10 seconds. When the time $t_3$ has past at a time B shown in FIG. 12A, the wafer 3f is introduced in the processing part 41 in the step 120. Therefore, there is no wafer in the processing part 41 from the time A to the time B, i.e., during the waiting time 18a. The transportation time starts at the time B and ends at the time A, and therefore, the definition of the transportation time shown in FIG. 5 can be applied. Through the step 109 and the others, the robot 5 transports the wafer 3e to the processing part 43 for the $CP_1$ processing.

Thus, an excess heat on wafers due to limitation in the rounding rate can be avoided by setting the common cycle time $T_0$ as well as by providing waiting times before the heat processing parts.

To be more precise, when it is not necessary to take a wafer out of the processing part in the step 116, the robot 5 waits for a taking-out time $T_{out}$, while the robot waits for a taking-in time $T_{in}$ when it is not necessary to take the wafer in the processing part in the step 120.

The wafer 3d belongs to the first lot different from the second lot including the wafers 3a to 3c, and is to be subjected to the processing $HP_2$ for a different time from the wafers 3a to 3c. The wafer 3d and the other respective wafers belonging to the first lot should be subjected to the processing $HP_2$ for a time shorter by $t_1=t_2=T_4-T_9=5$ seconds than a time of the processing $HP_2$ for the second lot. Since the cycle time $T_0$ is set in common to respective lots, a waiting time 18b of $t_4=5$ seconds can be provided for the wafer 3d. The wafer 3c which has been subjected to the processing $HP_2$ is taken out of the processing part 42 at the time A, and the wafer 3d is introduced therein at the time B.

As described above, the common cycle time $T_0$ is set for the plurality of the lots and the waiting times 18a and 18b are provided as a function of the cycle time $T_0$, so that an excess heat processing on respective wafers can be avoided. Furthermore, the respective wafers are processed in accordance with a temperature curve approximate to the ideal temperature curve shown in FIG. 15, and differences in a heat history among a plurality of lots. Further, a difference in the temperature curves for respective lots can also be avoided.

According to the preferred embodiment described above, each processing is conducted only for its own ideal processing time so that an unnecessary additional heat processing is not caused. Therefore, it does not result that temperature curves vary among wafers in each lot even when a plurality of lots having different processing times from each other are continuously processed.

Although it seems that productivity would fall down if the cycle item for the second lot is also set for 70 seconds, this is not true as understood from the following example. That is, assumed is a case where different cycle times are set for the first and second lots, i.e., cycle times of 70 and 65 seconds are assigned to the respective twenty five wafers in the first and second lots, respectively, and the latter cycle time of 65 seconds is effectuated only after all of the twenty five wafers in the first lot have been processed in the respective processing parts. In this case, the cycle time in the system is changed from 70 seconds to 65 seconds only after the last four wafers, i.e., the twenty-second to the twenty-fifth wafers, in the first lot have been subjected to the processings with the cycle time of 70 seconds. This means that 70 seconds×4=280 seconds is lost.

According to the preferred embodiment of the present invention described above, on the other hand, the lost time is only (70–65 seconds )×25=125 seconds which is lost in the waiting during the processings on the second lot. Therefore, the lost time is less and the productivity is higher in the preferred embodiment of the present invention than in the case of processing each lot independently.

By the virtue of the above-described processings according to the preferred embodiment, variation in critical exposure of a photoresist can be significantly reduced. A photoresist which is obtainable from Tokyo Ohka Kogyo Co., Ltd., Kawasaki, Kanagawa, Japan under the product name TSMR-8900 is used to coat silicon wafers in revolutions of 3800 rpm. Thus processed wafers are developed under the following conditions;

| Developer | NMD-3 2.38% (obtainable from Tokyo Ohka Kogyo Co., Ltd.) |
|---|---|
| Developing Time | 60 seconds |
| Temperature of Developer | 23° C. |
| Water Rinsing | 15 seconds |
| Drying | 15 seconds |

In the processing of coating the resist under the above developing conditions, critical exposure varies in the range of 20 mj with the conventional method of transporting a substrate, while it varies in the range of less than 5 mj with the method according to the preferred embodiment of the present invention.

As can be clearly understood to see the waiting times 18a and 18b according to the above-described preferred embodiment, a waiting time is not limited to be provided in a single heat processing part. In some cases, it may be provided in a plurality of heat processing parts. Such a case will be described below as another preferred embodiment of the present invention.

When the processing times $T_{11}$ to $T_{15}$ shown in Table 3 are applied to a lot, the total processing rate in the processing path is determined from the processing time $T_{90}$ of the processing C.

TABLE 3

| Processing HP$_1$ | $T_{11}$ - 70 seconds |
|---|---|
| Processing CP$_1$ | $T_{12}$ - 50 seconds |
| Processing C | $T_{13}$ - 90 seconds |
| Processing HP$_2$ | $T_{14}$ - 80 seconds |
| Processing HP$_2$ | $T_{15}$ - 50 seconds |

In order to satisfy the condition required in the step 107, a cycle time $T_0$ should be at least 90 seconds. Therefore, a cycle time $T_0$ is set as $T_0=90$ seconds, for example. Since the processings CP$_1$ and CP$_2$ are cool processings, it is not necessary to consider the problem of excess heat shown in FIG. 15(b). Thus, a waiting time $T_{W11}=t_0-T_{11}=20$ seconds is provided before the processing HP$_1$, while a waiting time $T_{W14}-T_0-T_{14}=10$ seconds is provided before the processing HP$_2$. The problem of an excess heat during the processings HP$_1$ and HP$_2$ can be thus avoided.

The total transportation time required for transporting a wafer through all the processing parts is 48 seconds, and the difference between the cycle time $T_0$ and the total transportation time is 42 seconds. The sum of the waiting times $T_{W11}$ and $T_{W14}$ is 30 seconds and is twelve-seconds less than the difference, i.e., 42 seconds. The robot 5 must wait for the time of twelve seconds other than the waiting times for introduction. The robot 5 may wait for this additional time at any positions. FIG. 12B shows an example in which the robot 5 waits for this additional time at the indexer 1. On arrows 16 representing flows of the processings conducted on respective wafers, time periods 18c and 18d represent the waiting times $T_{W11}$ and $T_{W14}$, respectively.

Figure 10:
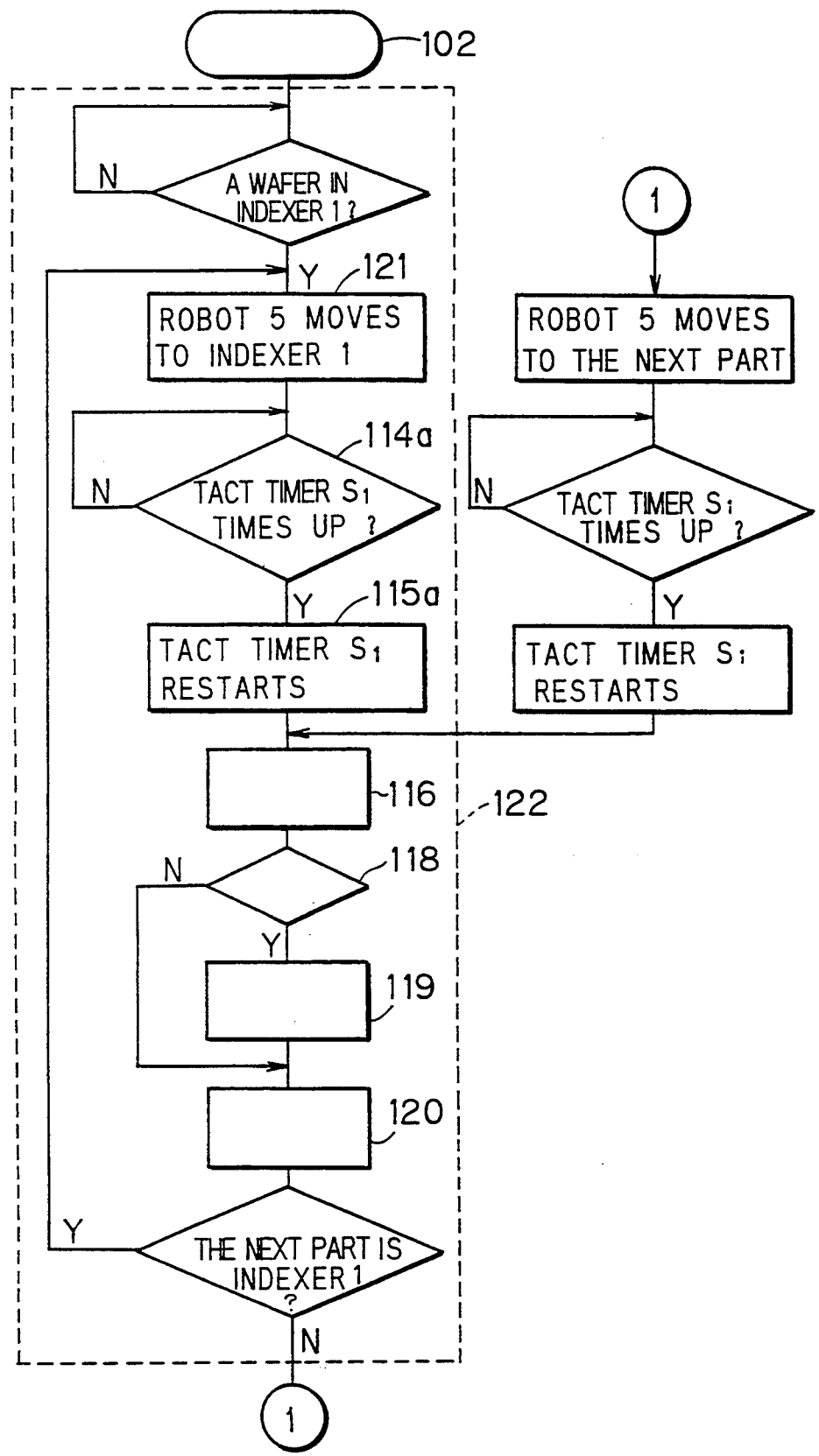

The waiting times may be provided under the control other than the control shown in FIG. 9. As shown in FIG. 10, the indexer 1 may control a master cycle timer $S_1$, while each processing part may control respective processing timers $S_1$, for example. Specifically, the interval between one departure and the next departure of the robot 5 from the indexer 1 is so controlled in the steps 121 and 114a as to be the cycle time $T_0$, and the master cycle timer $S_1$, is started in the step 115a. Exceptionally, the master timer $S_1$, immediately times up in the step 114a when the first wafer is introduced.

Figure 11:
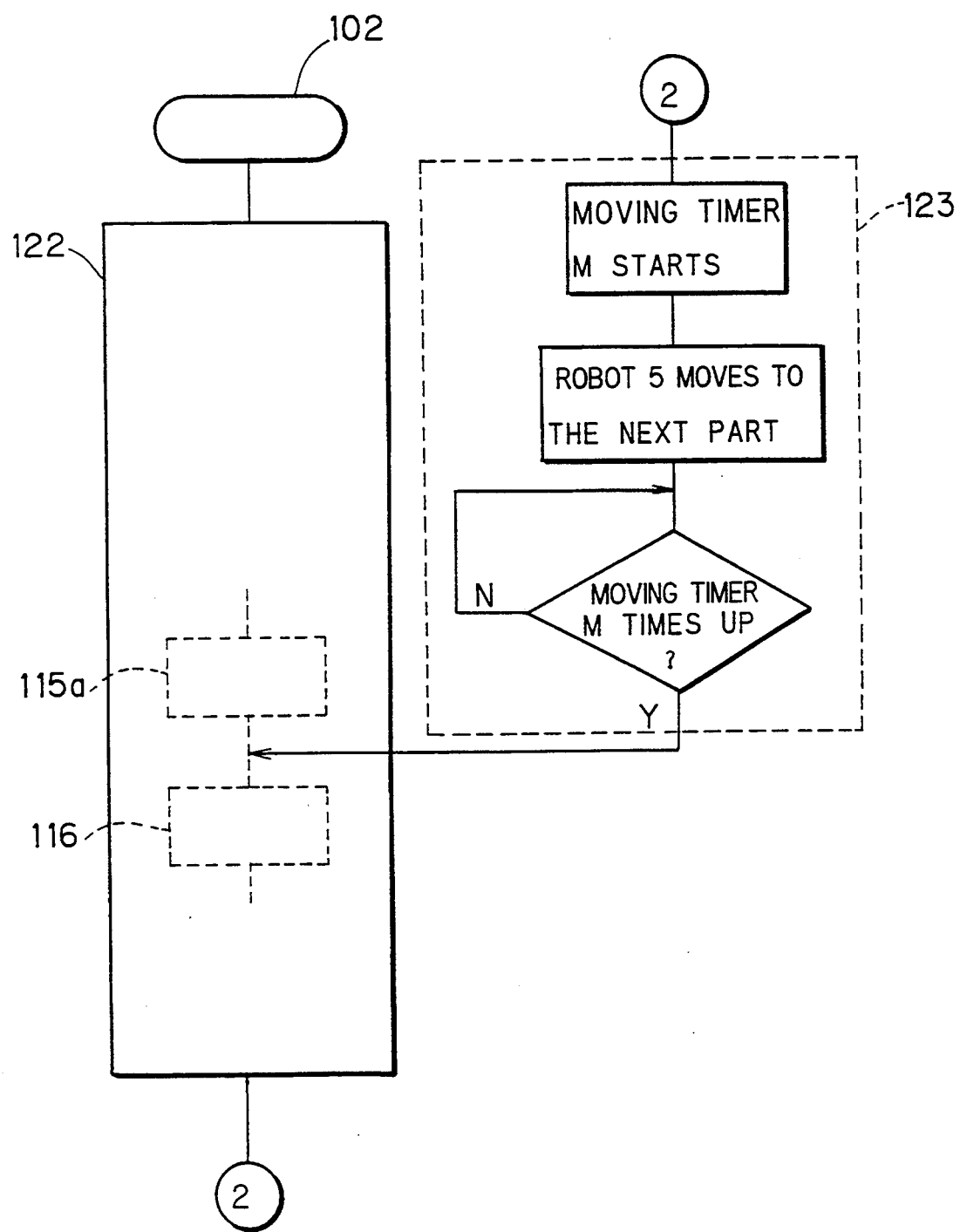

No processing times may be controlled in respective processing parts, as shown in FIG. 11. Step 112a has steps 124, 125 in addition to the step 122. In this case, the respective moving time $T_{move}$ of the robot 5 between two processing parts are controlled by a moving timer M (the step 123, 124).

When there is a lot which is not subjected to heat processings, the waiting times $T_{wj}$ for the lot may be determined according to the condition:

$$= \sum_{j=(m-1) \cdot N_1 + 1}^{m \cdot N_1} T_{wj} = 0 \tag{24}$$

or $$T_{wj} = 0 \text{ for } (m - 1) \cdot N_1 + 1 \leq j \leq m \cdot N_1 \tag{25}$$

where the number m indicates the lot.

While the invention has been shown and described in detail, the foregoing description is in all aspects illustrative and not restrictive. It is therefore understood that numerous modifications and variations can be devised without departing from the scope of the invention.

We claim:

1. A method of sequentially transporting semiconductor substrates with a transportation means in a system having first to N-th processing parts for applying predetermined processing to said semiconductor substrates, wherein said first to N-th processing parts have at least one heat processing part for applying heat to said semiconductor substrates and said semiconductor substrates are transported along a transportation path circulating said first to N-th processing parts, where the number N is an integer larger than one, said method comprising the steps of:

(a) determining parameter values including: a single cycle time $T_0$ common to the first to N-th processing parts and a waiting time $T_{wj}$ for each number j satisfying $1 \leq j \leq N$; and (b) serially transporting said semiconductor substrates to said first to N-th processing parts with said transporting means such that said transporting means repeatedly circulates along said processing path and a stream of said semiconductor substrates flows along said processing path via said first to N-th processing parts, comprising the steps of:

(b-1) obtaining a state in which semiconductor substrates $S_{j-i}$, $S_j$ and $S_{j+1}$ having come from the (j−2)-th, (j−1)-th and j-th processing parts are present in the (j−1)-th, j-th and (j+1)-th processing parts, respectively;

(b-2) transporting the semiconductor substrate $S_{j-1}$ from the (j−1)-th processing part to the j-th processing part with said transporting means;

(b-3) waiting before the j-th processing part until said cycle time $T_0$ is past since said transporting means having taken the semiconductor substrate $S_{j+1}$ out of the j-th processing part;

(b-4) taking the semiconductor substrate $S_j$ out of the j-th processing part when said cycle time $T_0$ is past;

(b-5) waiting for said waiting time $T_{wj}$;

(b-6) introducing said semiconductor substrate $S_{j-1}$ into the j-th processing part when said waiting time $T_{wj}$ is past;

(b-7) transporting the semiconductor substrate $S_j$ to the (j+1)-th with said transporting means; and (b-8) repeating the steps (b-1) to (b-7) for j=1, 2, ... ,N, where:

the (j−2)-th processing part for j=1 and 2;

the (j−1)-th processing part for j=1; and the (j+1)-th processing part for j=N;

represent a station for supplying said semiconductor substrate to said processing path and receiving said semiconductor substrates having been processed.

2. The method of claim 1, wherein;
the step (a) comprises the steps of:

(a-1) for each number j satisfying $1 \leq j \leq N$, determining a processing time $T_j$ representing how long said semiconductor substrates are to be processed in the j-th processing part; and (a-2) determining said cycle time $T_0$ so that the following first condition (I) is satisfied for each number j satisfying $1 \leq j \leq N$:

$$T_0 \geq T_j \qquad (I)$$

3. The method of claim 2, wherein;
the step (a) further comprises the steps of:

(a-3) determining a transporting time $T_c$ which is a minimum time for said transporting means to circulate said transporting path; and (a-4) determining said cycle time $T_0$ so that the following second condition (II) as well as said first condition are satisfied:

$$T_0 \geq T_c \qquad (II)$$

4. The method of claim 3, wherein;
said semiconductor substrates are classified into a plurality of lots; and
the step (a) further comprises the step of:

(a-5) determining said waiting time $t_{wj}$ so that the following third condition (III) as well as said first and second conditions are satisfied:

$$T_0 \leq T_c + S_m \qquad (III)$$

where the value $S_m$ is defined according to the following expression (E1):

$$S_m = \sum_{j=(m-1) \cdot N + 1}^{M \cdot N} T_{wj} \qquad (E1)$$

and the number m is a positive integer designating an m-th lot of said semiconductor substrates.

5. The method of claim 4, wherein;
the step (a-5) comprises the step of:

(a-5-1) determining said waiting time $T_{wj}$ so that the following fourth condition (IV) as well as said first through third conditions are satisfied:

$$T_0 T_c + T_{wj} \qquad (IV)$$

where j=1, 2, ..., N.

6. The method of claim 5, wherein;
said plurality of lots include k lots of semiconductor substrates, where k is a positive integer larger than one;
different sets of processing times $T_j$ for j=1, 2, ... N are determined for said k lots of semiconductor substrates to obtain $T_1$, $T_2$, ... $T_{N2}$, where N2=K.N; and
the step (a-5-1) comprises the step of:
determining said cycle time $T_0$ according to the following expression (E2):

$$T_0 = \max(T_1, T_2, \ldots, T_{N2}, T_c) \qquad (E2)$$

where the symbol max represents the maximum value among the respective values of $T_1, T_2, \ldots, T_{N2}$, and $T_c$.

7. The method of claim 6, wherein;
the step (a-5) further comprises the step of:

(a-5-2) providing a non-zero value to said waiting time $T_{wj}$ only for said heat processing part.

8. The method of claim 7, wherein;
the step (b) further comprises the step of:

(b-9) waiting at said station until said cycle time $T_0$ is past since said transporting means started said station last time.

9. A device for sequentially transporting semiconductor substrates in a system having first to N-th processing parts for applying predetermined processing to said semiconductor substrates, wherein said first to N-th processing parts have at least one heat processing part for applying heat to said semiconductor substrates and said semiconductor substrates are transported along a transportation path circulating said first to N-th processing parts, where the number N is an integer larger than one, said device comprising:

(a) transportation means for transporting a semiconductor substrate along said processing path;

(b) means for holding parameter values including: a single cycle time $T_0$ common to the first to N-th processing parts and a waiting time $T_{wj}$ for each number j satisfying $1 \leq j \leq N$;

(c) control means for generating control signal as a function of said parameter values to deliver said control signal to said transportation means in order to serially transport said semiconductor substrates to said first to N-th processing parts such that said transporting means repeatedly circulates along said processing path and a stream of said semiconductor substrates flows along said processing path via said first to N-th processing parts, said control means comprising:

(c-1) means for recognizing that said system is in a state in which semiconductor substrates $S_{j-1}$, $S_j$ and $S_{j+1}$ having come from the (j−2)-th, (j−1)-th and j-th processing parts are present in the (j−1)-th and (j+1)-th processing parts, respectively;

(c-2) means for controlling said transporting means so as to transport a semiconductor substrate $S_{j-1}$ from the (j−1)-th processing part to the j-th processing part;

(c-3) means for controlling said transportation means so as to wait before the j-th processing part until said cycle time $T_0$ is past since said transportation means having taken the semiconductor substrate $S_{j+1}$ out of the j-th processing part;

(c-4) means for controlling said transportation means so as to take the semiconductor substrate $S_j$ out of the j-th processing part when said cycle time $T_0$ is past;

(c-5) means for controlling said transportation means so as to wait for said waiting time $T_{wj}$;

(c-6) means for controlling said transportation means so as to introduce said semiconductor substrate $S_{j-1}$ into the j-th processing part when said waiting time $T_{wj}$ is past;

(c-7) means for controlling said transportation means so as to transport the semiconductor substrate $S_j$ to the (j+1)-th processing part; and (c-8) means for serially enabling the means (c-1) to (c-7) for j−1, 2, . . . , N, where
the (j−2)-th processing part for j=1 and 2;
the (j−1)-th processing part for j=1; and
the (j+1)-th processing part for j=N;
represent a station for supplying said semiconductor substrate to said processing path and receiving said semiconductor substrates having been processed.

10. The device of claim 9, wherein;
the means (b) comprises:
(b-1) means for holding a processing time $T_j$ representing how long said semiconductor substrates are to be processed in the j-th processing part for each number j satisfying $1 \leq j \leq N$; and
(b-2) means for accepting said cycle time $T_0$ only when the following first condition (I) is satisfied for each number j satisfying $1 \leq j \leq N$:

$$T_0 \geq T_j \qquad (I)$$

11. The device of claim 10, wherein;
the means (b) further comprises:
(b-3) means for holding a transporting time $T_c$ which is a minimum time for said transporting means to circulate said transporting path; and
(b-4) means for accepting said cycle time $T_0$ only when the following second condition (II) as well as said first condition are satisfied:

$$T_0 \geq T_c \qquad (II)$$

12. The device of claim 11, wherein;
said semiconductor substrates are classified into a plurality of lots; and
the means (b) further comprises:

(b-5) means for accepting said waiting time $T_{wj}$ only when the following third condition (III) as well as said first and second conditions are satisfied:

$$T_0 \geq T_c \geq S_m \qquad (III)$$

where the value $S_m$ is defined according to the following expression (E1):

$$S_m = \sum_{j=(m-1)\cdot N+1}^{M\cdot N} T_{wj} \qquad (E1)$$

and the number m is a positive integer designating an m-th lot of said semiconductor substrates.

13. The device of claim 12, wherein;
the means (b) further comprises:
(b-6) means for accepting said waiting time $T_{wj}$ only when the following fourth condition (IV) as well as said first through third conditions are satisfied:

$$T_0 \geq T_j + T_{wj} \qquad (IV)$$

where j=1, 2, . . . , N.

14. The device of claim 13, wherein;
said plurality of lot include k lots of semiconductor substrates, where k is a positive integer larger than one;
different sets of processing times $T_j$ for j=1, 2, . . . N are determined for said k lots of semiconductor substrates to obtain $T_1$, $T_2$, . . . $T_{N2}$ where N2=k.N; and
the means (b-6) further comprises:
(b-7) means for accepting said cycle time $T_0$ determined according to the following expression (E2):

$$T_0 = \max(T_1, T_2, \ldots, T_{N2}, T_c) \qquad (E2)$$

where the symbol max represents the maximum value among the respective values of $T_1, T_2, \ldots, T_{N2}$, and $T_c$.

15. The device of claim 14, wherein;
the means (b) further comprises:
(b-8) means for accepting a non-zero value of said waiting time $T_{wj}$ only for said heat processing part.

16. The device of claim 15, wherein;
the means (b) further comprises:
(b-9) means for inputting a trial value for said cycle time $T_0$;
the means (b-2) comprises:
(b-2-1) means for comparing said trial value for said cycle time $T_0$ with said processing times $T_1, T_2, \ldots T_{N2}$;
(b-2-2) means for employing said trial value for said cycle time $T_0$ when the condition (I) is satisfied; and
(b-2-3) means for inputting another trial value for said cycle time $T_0$ when the condition (I) is not satisfied.

17. The device of claim 16, wherein;
the means (b-4) comprises:
(b-4-1) means for comparing said trial value for said cycle time $T_0$ with said transporting time $T_c$;
(b-4-2) means for employing said trial value for said cycle time $T_0$ when the condition (II) as well as said condition (I) are satisfied; and
(b-4-3) means for inputting another trail value for said cycle time $T_0$ when the condition (II) is not satisfied.

18. The device of claim 17, wherein;

the means (b) further comprises:

(b-10) means for inputting respective trial values for said waiting times $T_1, T_2, \ldots T_{N2}$;

the means (b-5) comprises:

(b-5-1) means for comparing said cycle time $T_0$ with a sum of said transportation time $T_c$ and said respective trial values for said waiting times $T_1, T_2, \ldots T_{N2}$;

(b-5-2) means for employing said respective trial values for said waiting times $T_1, T_2, \ldots T_{N2}$ as said waiting times $T_1, T_2, \ldots T_{N2}$ when the condition (III) is satisfied; and (b-5-3) means for inputting other respective trial values for said waiting times $T_1, T_2, \ldots T_{N2}$ when the condition (III) is not satisfied.

19. The device of claim 18, wherein;

the means (b-6) comprises:

(b-6-1) means for comparing said cycle time $T_0$ with a sum of each of trail value for said waiting times $T_1, T_2, \ldots T_{N2}$ and said processing time $T_j$;

(b-6-2) means for employing said respective trial values for said waiting times $T_1, T_2, \ldots T_{N2}$ as said waiting times $T_1, T_2, \ldots T_{N2}$ when the condition (IV) is satisfied; and (b-6-3) means for inputting other respective trial values for said waiting times $T_1, T_2, \ldots, T_{N2}$ when the condition (IV) is not satisfied.

20. The device of claim 19, wherein;

the step (c) further comprises the step of:

(c-9) controlling said transporting means so as to wait at said station until said cycle time $T_0$ is past since said transporting means started said station last time.

21. A method of sequentially transporting semiconductor substrates with a transportation means in a system having first to N-th processing parts for applying predetermined processing to said semiconductor substrates, wherein said first to N-th processing parts have at least one heat processing part for applying heat to said semiconductor substrates and said semiconductor substrates are transported along a transportation path circulating said first to N-th processing parts, where the number N is an integer larger than one, said method comprising the steps of:

(a) determining parameter values including: a single cycle time $T_0$ common to the first to N-th processing parts, a waiting time $T_{wj}$ and a processing time $T_j$ representing how long said semiconductor substrates are to be processed in the j-th processing part for each number j satisfying $1 \leq j \leq N$; and (b) serially transporting said semiconductor substrates to said first to N-th processing parts with said transporting means such that said transporting means repeatedly circulates along said processing path and a stream of said semiconductor substrates flows along said processing path via said first to N-th processing parts, comprising the steps of:

(b-1) obtaining a state in which semiconductor substrates $S_{j-i}$, $S_j$ and $S_{j+1}$ having come from the (j−2)-th, (j−1)-th and j-th processing parts are present in the (j−1)-th, j-th and (j+1)-th processing parts, respectively;

(b-2) transporting the semiconductor substrate $S_{j-1}$ from the (j−1)-th processing part to the j-th processing part with said transporting means;

(b-3) waiting before the j-th processing part until said processing time $T_j$ is past since said transporting means having introduced in the semiconductor substrate $S_{j+1}$ into the j-th processing part;

(b-4) taking the semiconductor substrate $S_j$ out of the j-th processing part when said processing time $T_j$ is past;

(b-5) waiting for said waiting time $T_{wj}$;

(b-6) introducing said semiconductor substrate $S_{j-1}$ into the j-th processing part when said waiting time $T_{wj}$ is past;

(b-7) transporting the semiconductor substrate $S_j$ to the (j+1)-th with said transporting means; and (b-8) repeating the steps (b-1) to (b-7) for $j=1, 2, \ldots, N$, where:

the (j−2)-th processing part for j=1 and 2;

the (j−1)-th processing part for j=1; and the (j+1)-th processing part for j=N;

represent a station for supplying said semiconductor substrate to said processing path and receiving said semiconductor substrates having been processed.

22. The method of claim 21, wherein;

the step (a) comprises the step of:

(a-1) determining said cycle time $T^0$ so that the following first condition (I) is satisfied for each number j satisfying $1 \leq j \leq N$:

$$T_0 \geq T_j \quad \text{(I)}$$

23. The method of claim 22, wherein;

the step (a) further comprises the steps of:

(a-2) determining a transporting time $T_c$ which is a minimum time for said transporting means to circulate said transporting path; and (a-3) determining said cycle time $T_0$ so that the following second condition (II) as well as said first condition are satisfied:

$$T_0 \geq T_c \quad \text{(II)}$$

24. The method of claim 23, wherein;

said semiconductor substrates are classified into a plurality of lots; and the step (a) further comprises the step of:

(a-4) determining said waiting time $t_{wj}$ so that the following third condition (III) as well as said first and second conditions are satisfied:

$$T_0 \geq T_c + S_m \quad \text{(III)}$$

where the value $S_m$ is defined according to the following expression (E1):

$$S_m = \sum_{j=(m-1) \cdot N+1}^{M \cdot N} T_{wj} \quad \text{(E1)}$$

and the number m is a positive integer designating an m-th lot of said semiconductor substrates.

25. The method of claim 24, wherein;

the step (a-4) comprises the step of:

(a-4-1) determining said waiting time $T_{wj}$ so that the following fourth condition (IV) as well as said first through third conditions are satisfied:

$$T_0 \geq T_c + T_{wj} \quad \text{(IV)}$$

where $j=1, 2, \ldots, N$.

26. The method of claim 25, wherein;

said plurality of lots include k lots of semiconductor substrates, where k is a positive integer larger than one;

different sets of processing times $T_j$ for $j=1, 2, \ldots N$ are determined for said k lots of semiconductor substrates to obtain $T_1, T_2, \ldots T_{N2}$, where $N2 = K \cdot N$; and the step (a-4-1) comprises the step of:

determining said cycle time $T_0$ according to the following expression (E2):

$$T_0 = \max(T_1, T_2, \ldots, T_{N2}, T_c) \quad (E2)$$

where the symbol max represents the maximum value among the respective values of $T_1, T_2, \ldots, T_{N2}$, and $T_c$.

27. The method of claim 26, wherein;
the step (a-4) further comprises the step of:
(a-4-2) providing a non-zero value to said waiting time $T_{wj}$ only for said heat processing part.

28. The method of claim 27, wherein;
the step (b) further comprises the step of:
(b-9) waiting at said station until said cycle time $T_0$ is past since said transporting means started said station last time.

29. A device for sequentially transporting semiconductor substrates in a system having first to N-th processing parts for applying predetermined processing to said semiconductor substrates, wherein said first to N-th processing parts have at least one heat processing part for applying heat to said semiconductor substrates and said semiconductor substrates are transported along a transportation path circulating said first to N-th processing parts, where the number N is an integer larger than one, said device comprising:

(a) transportation means for transporting a semiconductor substrate along said processing path;

(b) means for holding parameter values including: a single cycle time $T_0$ common to the first to N-th processing parts, a waiting time $T_{wj}$ and a processing time $T_j$ representing how long said semiconductor substrates are to be processed in the j-th processing part for each number j satisfying $1 \leq j \leq N$;

(c) control means for generating control signal as a function of said parameter values to deliver said control signal to said transportation means in order to serially transport said semiconductor substrates to said first to N-th processing parts such that said transporting means repeatedly circulates along said processing path and a stream of said semiconductor substrates flows along said processing path via said first to N-th processing parts, said control means comprising:

(c-1) means for recognizing that said system is in a state in which semiconductor substrates $S_{j-1}$, $S_j$ and $S_{j+1}$ having come from the (j−2)-th, (j−1)-th and j-th processing parts are present in the (j−1)-th and j-th and (j+1)-th processing parts, respectively;

(c-2) means for controlling said transporting means so as to transport a semiconductor substrate $S_{j-1}$ from the (j−1)-th processing part to the j-th processing part;

(c-3) means for controlling said transportation means so as to wait before the j-th processing part until said processing time $T_j$ is past since said transportation means having introduced the semiconductor substrate $S_{j+1}$ into the j-th processing part;

(c-4) means for controlling said transportation means so as to take the semiconductor substrate $S_j$ out of the j-th processing part when said processing time $T_j$ is past;

(c-5) means for controlling said transportation means so as to wait for said waiting time $T_{wj}$;

(c-6) means for controlling said transportation means so as to introduce said semiconductor substrate $S_{j-1}$ into the j-th processing part when said waiting time $T_{wj}$ is past;

(c-7) means for controlling said transportation means so as to transport the semiconductor substrate $S_j$ to the (j+1)-th; and (c-8) means for serially enabling the means (c-1) to (c-7) for $j = 1, 2, \ldots, N$, where the (j−2)-th processing part for $j=1$ and 2;
the (j−1)-th processing part for $j=1$; and
the (j+1)-th processing part for $j=N$;

represent a station for supplying said semiconductor substrate to said processing path and receiving said semiconductor substrates having been processed.

30. The device of claim 29, wherein;
the means (b) comprises:
(b-1) means for accepting said cycle time $T_0$ only when the folllowing first condition (I) is satisfied for each number j satisfying $1 \leq j \leq N$:

$$T_0 \geq T_j \quad (I)$$

31. The device of claim 30, wherein;
the means (b) further comprises:
(b-2) means for holding a transporting time $T_c$ which is a minimum time for said transporting means to circulate said transporting path; and
(b-3) means for accepting said cycle time $T_0$ only when the following second condition (II) as well as said first condition are satisfied:

$$T_0 \geq T_c \quad (II)$$

32. The device of claim 31, wherein;
said semiconductor substrates are classified into a plurality of lots; and
the means (b) further comprises:
(b-4) means for accepting said waiting time $T_{wj}$ only when the following third condition (III) as well as said first and second conditions are satisfied:

$$T_0 \geq T_c \geq S_m \quad (III)$$

where the value $S_m$ is defined according to the following expression (E1):

$$S_m = \sum_{j=(m-1) \cdot N+1}^{M \cdot N} T_{wj} \quad (E1)$$

and the number m is a positive integer designating an m-th lot of said semiconductor substrates.

33. The device of claim 32, wherein;
the means (b) further comprises:
(b-5) means for accepting said waiting time $T_{wj}$ only when the following fourth condition (IV) as well as said first through third conditions are satisfied:

$$T_0 \geq T_j + T_{wj} \quad (IV)$$

where $j = 1, 2, \ldots, N$.

34. The device of claim 33, wherein;

said plurality of lot include k lots of semiconductor substrates, where k is a positive integer larger than one;

different sets of processing times $T_j$ for $j=1, 2, \ldots N$ are determined for said k lots of semiconductor substrates to obtain $T_1, T_2, \ldots T_{N2}$ where $N2=k.N$; and the means (b-5) further comprises:

(b-6) means for accepting said cycle time $T_0$ determined according to the following expression (E2):

$$T_0 = \max(T_1, T_2, \ldots, T_{N2}, T_c) \qquad (E2)$$

where the symbol max represents the maximum value among the respective values of $T_1, T_2, \ldots, T_{N2}$, and $T_c$.

35. The device of claim 34, wherein;
the means (b) further comprises:
(b-7) means for accepting a non-zero value of said waiting time $T_{wj}$ only for said heat processing part.

36. The device of claim 35, wherein;
the means (b) further comprises:
(b-8) means for inputting a trial value for said cycle time $T_0$;
the means (b-1) comprises:
(b-1-1) means for comparing said trial value for said cycle time $T_0$ with said processing times $T_1, T_2, \ldots T_{N2}$;
(b-1-2) means for employing said trial value for said cycle time $T_0$ when the condition (I) is satisfied; and
(b-1-3) means for inputting another trial value for said cycle time $T_0$ when the condition (I) is not satisfied.

37. The device of claim 36, wherein;
the means (b-3) comprises:
(b-3-1) means for comparing said trial value for said cycle time $T_0$ with said transporting time $T_c$;
(b-3-2) means for employing said trial value for said cycle time $T_0$ when the condition (II) as well as said condition (I) are satisfied; and
(b-3-3) means for inputting another trail value for said cycle time $T_0$ when, the condition (II) is not satisfied.

38. The device of claim 37, wherein;
the means (b) further comprises:
(b-9) means for inputting respective trial values for said waiting times $T_1, T_2, \ldots T_{N2}$;
the means (b-4) comprises:
(b-4-1) means for comparing said cycle time $T_0$ with a sum of said transportation time $T_c$ and said respective trial values for said waiting times $T_1, T_2, \ldots T_{N2}$;
(b-4-2) means for employing said respective trial values for said waiting times $T_1, T_2, \ldots T_{N2}$ as said waiting times $T_1, T_2, \ldots T_{N2}$ when the condition (III) is satisfied; and
(b-4-3) means for inputting other respective trial values for said waiting times $T_1, T_2, \ldots T_{N2}$ when the condition (III) is not satisfied.

39. The device of claim 38, wherein;
the means (b-5) comprises:
(b-5-1) means for comparing said cycle time $T_0$ with a sum of each of trail value for said waiting times $T_1, T_2, \ldots T_{N2}$ and said processing time $T_j$;
(b-5-2) means for employing said respective trial values for said waiting times $T_1, T_2, \ldots T_{N2}$ as said waiting times $T_1, T_2, \ldots T_{N2}$ when the condition (IV) is satisfied; and (b-5-3) means for inputting other respective trial values for said waiting times $T_1, T_2, \ldots, T_{N2}$ when the condition (IV) is not satisfied.

40. The device of claim 39, wherein;
the step (c) further comprises the step of:
(c-9) controlling said transporting means so as to wait at said station until said cycle time $T_0$ is past since said transporting means started said station last time.

41. A method of sequentially transporting semiconductor substrates with a transportation means in a system having first to N-th processing parts for applying predetermined processing to said semiconductor substrates, wherein said first to N-th processing parts have at least one heat processing part for applying heat to said semiconductor substrates and said semiconductor substrates are transported along a transportation path circulating said first to N-th processing parts, where the number N is an integer larger than one, said method comprising the steps of:

(a) determining parameter values including: a single cycle time $T_0$ common to the first to N-th processing parts, a waiting time $T_{wj}$ and a moving time $T_{mj}$ for each number j satisfying $1 \leq j \leq N$; and (b) serially transporting said semiconductor substrates to said first to N-th processing parts with said transporting means such that said transporting means repeatedly circulates along said processing path and a stream of said semiconductor substrates flows along said processing path via said first to N-th processing parts, comprising the steps of:

(b-1) obtaining a state in which semiconductor substrates $S_{j-1}$, $S_j$ and $S_{j+1}$ having come from the (j−2)-th, (j−1)-th and j-th processing parts are present in the (j−1)-th, j-th and (j+1)-th processing parts, respectively;

(b-2) transporting the semiconductor substrate $S_{j-1}$ from the (j−1)-th processing part to the j-th processing part with said transporting means by said moving time $T_{m(j-1)}$;

(b-3) taking the semiconductor substrate $S_j$ out of the j-th processing part when said transporting means reach the j-th processing part;

(b-4) waiting for said waiting time $T_{wj}$;

(b-5) introducing said semiconductor substrate $S_{j-1}$ into the j-th processing part when said waiting time $T_{wj}$ is past;

(b-6) transporting the semiconductor substrate $S_j$ to the (j+1)-th processing prart, with said transporting means by said moving time $T_{mj}$; and (b-7) repeating the steps (b-1) to (b-6) for $j=1, 2, \ldots, N$, where:
the (j−2)-th processing part for $j=1$ and 2;
the (j−1)-th processing part for $j=1$; and
the (j+1)-th processing part for $j=N$;
represent a station for supplying said semiconductor substrate to said processing path and receiving said semiconductor substrates having been processed.

42. The method of claim 41, wherein;
the step (a) comprises the step of:
(a-1) for each number j satisfying $1 \leq j \leq N$, determining a processing time $T_j$ representing how long said semiconductor substsrates are to be processed in the j-th processing part; and
(a-2) determining said cycle time $T^0$ so that the following first condition (I) is satisfied for each number j satisfying $1 \leq j \leq N$:

$$T_0 \geq T_j \qquad (I)$$

43. The method of claim 42, wherein;
the step (a) further comprises the steps of:
(a-3) determining a transporting time $T_c$ which is a minimum time for said transporting means to circulate said transporting path; and
(a-4) determining said cycle time $T_0$ so that the following second condition (II) as well as said first condition are satisfied:

$$T_0 \geq T_c \qquad (II)$$

44. The method of claim 43, wherein;
said semiconductor substrates are classified into a plurality of lots; and
the step (a) further comprises the step of:
(a-4) determining said waiting time $t_{wj}$ so that the following third condition (III) as well as said first and second conditions are satisfied:

$$T_0 \geq T_c + S_m \qquad (III)$$

where the value $S_m$ is defined according to the following expression (E1):

$$S_m = \sum_{j=(m-1)\cdot N+1}^{M\cdot N} T_{wj} \qquad (E1)$$

and the number m is a positive integer designating an m-th lot of said semiconductor substrates.

45. The method of claim 44, wherein;
the step (a-5) comprises the step of:
(a-5-1) determining said waiting time $T_{wj}$ so that the following fourth condition (IV) as well as said first through third conditions are satisfied:

$$T_0 \geq T_c + T_{wj} \qquad (IV)$$

where $j = 1, 2, \ldots, N$.

46. The method of claim 45, wherein;
said plurality of lots include k lots of semiconductor substrates, where k is a positive integer larger than one;
different sets of processing times $T_j$ for $j = 1, 2, \ldots N$ are determined for said k lots of semiconductor substrates to obtain $T_1, T_2, \ldots T_{N2}$, where $N2 = K \cdot N$; and
the step (a-5-1) comprises the step of:
determining said cycle time $T_0$ according to the following expression (E2):

$$T_0 = \max(T_1, T_2, \ldots, T_{N2}, T_c) \qquad (E2)$$

where the symbol max represents the maximum value among the respective values of $T_1, T_2, \ldots, T_{N2}$, and $T_c$.

47. The method of claim 46, wherein;
the step (a-5) further comprises the step of:
(a-5-2) providing a non-zero value to said waiting time $T_{wj}$ only for said heat processing part.

48. The method of claim 47, wherein;
the step (b) further comprises the step of:
(b-9) waiting at said station until said cycle time $T_0$ is past since said transporting means started said station last time.

49. A device for sequentially transporting semiconductor substrates in a system having first to N-th processing parts for applying predetermined processing to said semiconductor substrates, wherein said first to N-th processing parts have at least one heat processing part for applying heat to said semiconductor substrates and said semiconductor substrates are transported along a transportation path circulating said first to N-th processing parts, where the number N is an integer larger than one, said device comprising:

(a) transportation means for transporting a semiconductor substrate along said processing path by a moving time $T_{mj}$ when said transportation measns moves from j-th processing part for each number j satisfying $1 \leq j \leq N$;
(b) means for holding parameter values including: a single cycle time $T_0$ common to the first to N-th processing parts, a waiting time $T_{wj}$ and said moving time $T_{mj}$ for each number j satisfying $1 \leq j \leq N$;
(c) control means for generating control signal as a function of said parameter values to deliver said control signal to said transportation means in order to serially transport said semiconductor substrates to said first to N-th processing parts such that said transporting means repeatedly circulates along said processing path and a stream of said semiconductor substrates flows along said processing path via said first to N-th processing parts, said control means comprising:
(c-1) means for recognizing that said system is in a state in which semiconductor substrates $S_{j-1}$, $S_j$ and $S_{j+1}$ having come from the (j−2)-th, (j−1)-th and j-th processing parts are present in the (j−1)-th and (j+1)-th processing parts, respectively;
(c-2) means for controlling said transporting means so as to transport a semiconductor substrate $S_{j-1}$ from the (j−1)-th processing part to the j-th processing part, by said moving time $T_{mj}$;
(c-3) means for controlling said transportation means so as to take the semiconductor substrate $S_j$ out of the j-th processing part when said transporting means reach the j-th processing part;
(c-4) means for controlling said transportation means so as to wait for said waiting time $T_{wj}$;
(c-5) means for controlling said transportation means so as to introduce said semiconductor substrate $S_{j-1}$ into the j-th processing part when said waiting time $T_{wj}$ is past;
(c-6) means for controlling said transportation means so as to transport the semiconductor substrate $S_j$ to the (j+1)-th processing part by said moving time $T_{mj}$; and
(c-7) means for serially enabling the means (c-1) to (c-6) for $j = 1, 2, \ldots N$, where
the (j−2)-th processing part for $j = 1$ and 2;
the (j−1)-th processing part for $j = 1$; and
the (j+1)-th processing part for $j = N$;
represent a station for supplying said semiconductor substrate to said processing path and receiving said semiconductor substrates having been processed.

50. The device of claim 49, wherein;
the means (b) comprises:
(b-1) means for holding a processing time $T_j$ representing how long said seminconductor substrates are to be processed in the j-th processing part for each number j satisfying $1 \leq j \leq N$; and
(b-2) means for accepting said cycle time $T_0$ only when the following first condition (I) is satisfied for each number j satisfying $1 \leq j \leq N$:

$$T_0 \geq T_j \qquad (I)$$

51. The device of claim 50, wherein;
the means (b) further comprises:
(b-3) means for holding a transporting time $T_c$ which is a minimum time for said transporting means to circulate said transporting path; and
(b-4) means for accepting said cycle time $T_0$ only when the following second condition (II) as well as said first condition are satisfied:

$$T_0 \geq T_c \tag{II}$$

52. The device of claim 51, wherein;
said semiconductor substrates are classified into a plurality of lots; and
the means (b) further comprises:
(b-5) means for accepting said waiting time $T_{wj}$ only when the following third condition (III) as well as said first and second conditions are satisfied:

$$T_0 \geq T_c \geq S_m \tag{III}$$

where the value $S_m$ is defined according to the following expression (E1):

$$S_m = \sum_{j=(m-1)\cdot N+1}^{M \cdot N} T_{wj} \tag{E1}$$

and the number m is a positive integer designating an m-th lot of said semiconductor substrates.

53. The device of claim 52, wherein;
the means (b) further comprises:
(b-6) means for accepting said waiting time $T_{wj}$ only when the following fourth condition (IV) as well as said first through third conditions are satisfied:

$$T_0 \geq T_j + T_{wj} \tag{IV}$$

where $j = 1, 2, \ldots, N$.

54. The device of claim 53, wherein;
said plurality of lot include k lots of semiconductor substrates, where k is a positive integer larger than one;
different sets of processing times $T_j$ for $j = 1, 2, \ldots N$ are determined for said k lots of semiconductor substrates to obtain $T_1, T_2, \ldots T_{N2}$ where $N2 = k \cdot N$; and
the means (b) further comprises:
(b-7) means for accepting said cycle time $T_0$ determined according to the following expression (E2):

$$T_0 = \max(T_1, T_2, \ldots, T_{N2}, T_c) \tag{E2}$$

where the symbol max represents the maximum value among the respective values of $T_1, T_2, \ldots, T_{N2}$, and $T_c$.

55. The device of claim 54, wherein;
the means (b) further comprises:

(b-8) means for accepting a non-zero value of said waiting time $T_{wj}$ only for said heat processing part.

56. The device of claim 55, wherein;
the means (b) further comprises:
(b-8) means for inputting a trial value for said cycle time $T_0$;
the means (b-2) comprises:
(b-2-1) means for comparing said trial value for said cycle time $T_0$ with said processing times $T_1, T_2, \ldots T_{N2}$;
(b-2-2) means for employing said trial value for said cycle time $T_0$ when the condition (I) is satisfied; and
(b-2-3) means for inputting another trial value for said cycle time $T_0$ when the condition (I) is not satisfied.

57. The device of claim 56, wherein;
the means (b-4) comprises:
(b-4-1) means for comparing said trial value for said cycle time $T_0$ with said transporting time $T_c$;
(b-4-2) means for employing said trial value for said cycle time $T_0$ when the condition (II) as well as said condition (I) are satisfied; and
(b-4-3) means for inputting another trail value for said cycle time $T_0$ when the condition (II) is not satisfied.

58. The device of claim 57, wherein;
the means (b) further comprises:
(b-9) means for inputting respective trial values for said waiting times $T_1, T_2, \ldots T_{N2}$;
the means (b-5) comprises:
(b-5-1) means for comparing said cycle time $T_0$ with a sum of said transportation time $T_c$ and said respective trial values for said waiting times $T_1, T_2, \ldots T_{N2}$;
(b-5-2) means for employing said respective trial values for said waiting times $T_1, T_2, \ldots T_{N2}$ as said waiting times $T_1, T_2, \ldots T_{N2}$ when the condition (III) is satisfied; and
(b-5-3) means for inputting other respective trial values for said waiting times $T_1, T_2, \ldots T_{N2}$ when the condition (III) is not satisfied.

59. The device of claim 58, wherein;
the means (b-6) comprises:
(b-6-1) means for comparing said cycle time $T_0$ with a sum of each of trail value for said waiting times $T_1, T_2, \ldots T_{N2}$ and said processing time $T_j$;
(b-6-2) means for employing said respective trial values for said waiting times $T_1, T_2, \ldots T_{N2}$ as said waiting times $T_1, T_2, \ldots T_{N2}$ when the condition (IV) is satisfied; and
(b-6-3) means for inputting other respective trial values for said waiting times $T_1, T_2, \ldots, T_{N2}$ when the condition (IV) is not satisfied.

60. The device of claim 59, wherein;
the step (c) further comprises the step of:
(c-9) controlling said transporting means so as to wait at said station until said cycle time $T_0$ is past since said transporting means started said station last time.

* * * * *